(12) United States Patent
Okubo et al.

(10) Patent No.: US 12,538,710 B2
(45) Date of Patent: *Jan. 27, 2026

(54) MAGNETOSTRICTIVE MEMBER AND METHOD FOR MANUFACTURING MAGNETOSTRICTIVE MEMBER

(71) Applicant: SUMITOMO METAL MINING CO., LTD., Tokyo (JP)

(72) Inventors: Kazuhiko Okubo, Ome (JP); Kazutaka Osako, Ome (JP); Kiyoshi Izumi, Ome (JP)

(73) Assignee: SUMITOMO METAL MINING CO., LTD., Tokyo (JP)

(*) Notice: Subject to any disclaimer, the term of this patent is extended or adjusted under 35 U.S.C. 154(b) by 220 days.

This patent is subject to a terminal disclaimer.

(21) Appl. No.: 18/276,170

(22) PCT Filed: Feb. 4, 2022

(86) PCT No.: PCT/JP2022/004486
§ 371 (c)(1),
(2) Date: Aug. 7, 2023

(87) PCT Pub. No.: WO2022/172875
PCT Pub. Date: Aug. 18, 2022

(65) Prior Publication Data
US 2024/0130241 A1 Apr. 18, 2024

(30) Foreign Application Priority Data
Feb. 9, 2021 (JP) ................. 2021-019132

(51) Int. Cl.
*H10N 35/85* (2023.01)
*C30B 29/52* (2006.01)
(Continued)

(52) U.S. Cl.
CPC ............. *H10N 35/85* (2023.02); *C30B 29/52* (2013.01); *H10N 35/01* (2023.02); *H10N 35/101* (2023.02); *C30B 11/00* (2013.01)

(58) Field of Classification Search
CPC ......... C30B 11/00; C30B 29/52; H10N 35/01; H10N 35/101; H10N 35/85
See application file for complete search history.

(56) References Cited

U.S. PATENT DOCUMENTS

| 2013/0140919 A1 | 6/2013 | Ueno et al. |
| 2015/0028724 A1 | 1/2015 | Summers et al. |

(Continued)

FOREIGN PATENT DOCUMENTS

| EP | 4064372 A1 | 9/2022 |
| JP | H04-108699 A | 4/1992 |

(Continued)

OTHER PUBLICATIONS

Extended Supplementary European Search Report dated Nov. 28, 2024, issued in counterpart Application No. 22752699.3. (12 pages).

(Continued)

*Primary Examiner* — Gerard Higgins
(74) *Attorney, Agent, or Firm* — WHDA, LLP

(57) ABSTRACT

The magnetostrictive member is formed of a single crystal of an iron-based alloy having magnetostrictive characteristics, is a plate-like body having a long-side direction and a short-side direction, and has a lattice constant of a <100> orientation in the short-side direction larger than a lattice constant of a <100> orientation in the long-side direction.

6 Claims, 8 Drawing Sheets

(51) Int. Cl.
*H10N 35/00* (2023.01)
*H10N 35/01* (2023.01)
*C30B 11/00* (2006.01)

(56) References Cited

U.S. PATENT DOCUMENTS

| | | |
|---|---|---|
| 2017/0317266 A1 | 11/2017 | Imai |
| 2018/0233654 A1 | 8/2018 | Imai |
| 2023/0074828 A1 | 3/2023 | Okubo et al. |

FOREIGN PATENT DOCUMENTS

| | | | |
|---|---|---|---|
| JP | 2015-517024 A | 6/2015 | |
| JP | 2016-028831 A | 3/2016 | |
| JP | 2016-138028 A | 8/2016 | |
| JP | 2020-158346 A | 10/2020 | |
| JP | 2020200209 A * | 12/2020 | |
| WO | 2011/158473 A1 | 12/2011 | |
| WO | WO-2021100467 A1 * | 5/2021 | ........... C22C 38/002 |

OTHER PUBLICATIONS

Orr, Allison et al., "Influence of Shape Anisotropy and Temperature on Magnetostrictive Behavior in Single-Crystal Galfenol Alloys", IEEE Transactions on Magnetics, vol. 53, No. 11, pp. 1-4, 2017; Cited in Extended Supplementary European Search Report dated Nov. 28, 2024 (4 pages).

Allenstein, U. et al., "Fe-Pd based ferromagnetic shape memory actuators for medical applications: Biocompatibility, effect of surface roughness and protein coatings", Acta Biomaterialia, vol. 9, pp. 5845-5853, 2013; Cited in Extended Supplementary European Search Report dated Nov. 28, 2024 (9 pages).

Zhou, Chao et al., "Improved magnetostriction in Galfenol alloys by aligning crystal growth direction along easy magnetization axis", Scientific Reports, vol. 10, 2020; Cited in Extended Supplementary European Search Report dated Nov. 28, 2024 (8 pages).

Clark A. E. et al., Extraordinary magnetoelasticity and lattice softening in bcc Fe—Ga alloys, Appl. Phys, 93(2003) 8621. (3 pages); cited in the specification.

Park J. et al., Stress-anneal-induced magnetic anisotropy in highly textured Fe—Ga and Fe—Al magnetostrictive strips for bending-mode vibrational energy harvesters, AIP Advances 6 056221 (2016). (7 pages); cited in the specification.

Ueno T., Energy Harvesting and Actuator Technology Using Magnetostrictive Material, Current Status and Prospective, Journal of the Japan Society of Precision Engineering, vol. 79, No. 4, p. 305-308, 2013, with English translation. (8 pages); cited in the specification.

International Search Report dated Apr. 5, 2022, issued in counterpart Application No. PCT/JP2022/004486, with English translation. (4 pages).

Notification of Transmittal of Translation of the International Preliminary Report on Patentability (Form PCT/IB/373) issued in counterpart International Application No. PCT/JP2022/004486 mailed Apr. 5, 2022 with Forms PCT/ISA/237. (9 pages).

* cited by examiner

WHEN PARALLEL MAGNETOSTRICTION AMOUNT IS LARGER

WHEN PARALLEL MAGNETOSTRICTION AMOUNT IS SMALLER

SINGLE CRYSTAL

THIN PLATE MEMBER

MAGNETOSTRICTIVE MEMBER

MAGNETOSTRICTIVE MEMBER AND METHOD FOR MANUFACTURING MAGNETOSTRICTIVE MEMBER

TECHNICAL FIELD

The present invention relates to a magnetostrictive member and a method for manufacturing a magnetostrictive member.

BACKGROUND ART

Magnetostrictive materials are attracting attention as functional materials. For example, Fe—Ga alloys, which are iron-based alloys, are materials exhibiting the magnetostrictive effect and the reverse magnetostrictive effect, showing a large magnetostriction of about 100 to 350 ppm. For this reason, in recent years, they have attracted attention as a material for vibration power generation in the energy harvesting field and are expected to be applied to wearable terminals and sensors. As a method for manufacturing a single crystal of an Fe—Ga alloy, a method for growing a single crystal by the pull-up method (the Czochralski method, hereinafter abbreviated as the "Cz method") is known (e.g., Patent Literature 1). In addition, as methods of manufacture other than the Cz method, the vertical Bridgman method (the VB method) and the vertical temperature gradient freeze method (the VGF method) are known (e.g., Patent Literature 2 and Patent Literature 3).

The Fe—Ga alloy has an easy axis of magnetization in the <100> orientation of the crystal and can exhibit large magnetic distortion in this orientation. Conventionally, magnetostrictive members of the Fe—Ga alloy have been manufactured by cutting a single crystal part oriented in the <100> orientation from an Fe—Ga polycrystal to a desired size (e.g., Non-Patent Literature 1); crystal orientation significantly affects magnetostrictive characteristics, and thus a single crystal in which the direction in which the magnetostriction of magnetostrictive members is required and the <100> orientation, in which the magnetic strain of the crystal is maximum, are matched with each other is considered to be optimum for the material of magnetostrictive members.

The single crystal of the Fe—Ga alloy exhibits positive magnetostriction when a magnetic field is applied in parallel to the <100> orientation of the single crystal (hereinafter referred to as a "parallel magnetostriction amount"). On the other hand, when a magnetic field is applied perpendicularly to the <100> orientation, negative magnetostriction is exhibited (hereinafter referred to as a "perpendicular magnetostriction amount"). As the intensity of the applied magnetic field is gradually increased, the parallel magnetostriction amount or the perpendicular magnetostriction amount is saturated. A magnetostriction constant ($3/2\lambda 100$) is determined by the difference between the saturated parallel magnetostriction amount and the saturated perpendicular magnetostriction amount and is determined by Expression (1) below (e.g., Patent Literature 4 and Non-Patent Literature 2).

$$3/2\lambda_{100} = \varepsilon(//) - \varepsilon(\perp) \qquad \text{Expression (1)}$$

$3/2\lambda_{100}$: the magnetostriction constant $\varepsilon(//)$: the parallel magnetostriction amount when saturated by applying a magnetic field in parallel to the <100> direction $\varepsilon(\perp)$: the perpendicular magnetostriction amount when saturated by applying a magnetic field perpendicularly to the <100> direction The magnetostrictive characteristics of the Fe—Ga alloy are considered to affect the magnetostrictive and inverse magnetostrictive effects and the characteristics of magnetostrictive vibration power generation devices and are important parameters for device design (e.g., Non-Patent Literature 4). In particular, the magnetostriction constant depends on the Ga composition of the Fe—Ga alloy single crystal, and it is known that the magnetostriction constant reaches its maximum at Ga compositions of 18 to 19 at % and 27 to 28 at % (e.g., Non-Patent Literature 2), and it is desirable to use Fe—Ga alloys with such Ga concentrations for devices. Furthermore, in recent years, it has been reported that, in addition to the magnetostriction constant being large, a larger parallel magnetostriction amount tends to result in higher device characteristics such as output voltage (e.g., Non-Patent Literature 3).

A magnetostrictive vibration power generation device, for example, includes an Fe—Ga magnetostrictive member wound by a coil, as well as a yoke and a field permanent magnet (e.g., Patent Literature 5 and Non-Patent Literature 4). In this magnetostrictive vibration power generation device, as a mechanism, when the yoke as a movable part of the device is vibrated, the Fe—Ga magnetostrictive member fixed at the center of the yoke vibrates in tandem, the magnetic flux density of the coil wound on the Fe—Ga magnetostrictive member changes due to the reverse magnetostriction effect, and electromagnetic induction electromotive force is generated to generate power. In the magnetostrictive vibration power generation device, a force is applied in the long-side direction of the yoke to cause vibration, and thus the Fe—Ga magnetostrictive member for use in the device is desirably processed such that <100>, which is the easy axis of magnetization, is in the long-side direction.

CITATION LIST

Patent Literature

[Patent Literature 1] Japanese Unexamined Patent Application Publication No. 2016-28831

[Patent Literature 2] Japanese Unexamined Patent Application Publication No. 2016-138028

[Patent Literature 3] Japanese Unexamined Patent Application Publication No. H04-108699

[Patent Literature 4] Japanese Translation of PCT Application Publication No. 2015-517024

[Patent Literature 5] WO2011/158473

Non-Patent Literature

[Non-Patent Literature 1] Etrema, State of the Art of Galfenol Processing.

[Non-Patent Literature 2] A. E. Clark et al., Appl. Phys. 93 (2003) 8621.

[Non-Patent Literature 3] Jung Jin Park, Suok-Min Na, Ganesh Raghunath, and Alison B. Flatau. AIP Advances 6, 056221 (2016).

[Non-Patent Literature 4] Toshiyuki Ueno, Journal of Japan Society for Precision Engineering Vol. 79, No. 4, (2013) 305-308.

SUMMARY OF INVENTION

Technical Problem

The device characteristics of magnetostrictive vibration power generation devices or the like are affected by the magnetostrictive characteristics of the magnetostrictive member, and thus the magnetostrictive member is required to have high magnetostrictive characteristics and a small variation in the magnetostrictive characteristics. Given these circumstances, it has been believed that if the crystal orientation of the single crystal of the Fe—Ga alloy is <100> and the Ga concentration is uniform, a magnetostrictive member with a uniform magnetostriction constant can be obtained. However, as described in Non-Patent Literature 3, it is disclosed that the device characteristics are affected by the parallel magnetostriction amount as well as the magnetostriction constant. Examinations by the inventors of the present invention have revealed that the magnetostrictive member manufactured as described above has a variation in the parallel magnetostriction amount (or the perpendicular magnetostriction amount) even if the magnetostriction constant is uniform and that the magnetostriction constant itself varies.

Given these circumstances, an object of the present invention is to provide a magnetostrictive member having a high magnetostriction constant and a high parallel magnetostriction amount and small variations in the magnetostriction constant and the parallel magnetostriction amount among members and a method for manufacturing such a magnetostrictive member.

Solution to Problem

An aspect of the present invention provides a magnetostrictive member formed of a single crystal of an iron-based alloy having magnetostrictive characteristics, being a plate-like body having a long-side direction and a short-side direction, and having a lattice constant of a <100> orientation in the short-side direction larger than a lattice constant of a <100> orientation in the long-side direction.

In the magnetostrictive member of an aspect of the present invention, the lattice constant of the <100> orientation in the short-side direction may be larger than the lattice constant of the <100> orientation in the long-side direction by 300 ppm or more. The iron-based alloy may be an Fe—Ga alloy, the magnetostrictive member may have a lattice constant in the long-side direction of 2.9034 Å or less, have one of lattice constants of <100> orientations other than the long-side direction larger than the lattice constant of the <100> orientation in the long-side direction by 0.0008 Å or more, the magnetostrictive member may have a magnetostriction constant of 250 ppm or more, and the magnetostrictive member may have a parallel magnetostriction amount of 250 ppm or more, the parallel magnetostriction amount being a magnetostriction amount when a magnetic field parallel to the long-side direction is applied and a magnetostriction amount in the long-side direction is saturated. The thickness of the magnetostrictive member may be 0.3 mm or more and 2 mm or less.

An aspect of the present invention provides a method for manufacturing a magnetostrictive member, the method including acquiring a plate-like body formed of a crystal of an iron-based alloy having magnetostrictive characteristics, having a long-side direction and a short-side direction, and having a lattice constant of a <100> orientation in the short-side direction larger than a lattice constant of a <100> orientation in the long-side direction.

An aspect of the present invention provides a magnetostrictive member formed of a single crystal of an iron-based alloy having magnetostrictive characteristics, and being a plate-like body having a long-side direction and a short-side direction, at least one of a front face and a back face of the plate-like body having a one-direction processed face with the long-side direction serving as a processing direction.

Advantageous Effects

The magnetostrictive member of an aspect of the present invention has the characteristics of a high magnetostriction constant and a high parallel magnetostriction amount and small variations in the magnetostriction constant and the parallel magnetostriction amount among members. The method for manufacturing a magnetostrictive member of an aspect of the present invention can easily manufacture a magnetostrictive member having a high magnetostriction constant and a high parallel magnetostriction amount and small variations in the magnetostriction constant and the parallel magnetostriction amount among members.

DESCRIPTION OF EMBODIMENTS

The following describes specific embodiments of the present invention in detail. The present invention is not limited to the following embodiments and can be modified as appropriate to the extent that the gist of the present invention is not changed. Part or the whole of each of the drawings is schematically described and is described on different scales as appropriate. In the following description, the description "A to B" means "A or more and B or less."

EMBODIMENTS

Figure 1A:
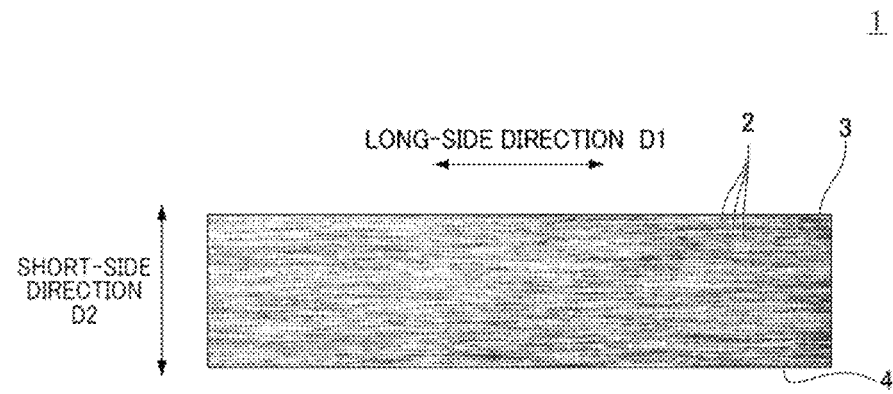
FIGS. 1A and 1B are drawing-substitute photographs showing an example of a magnetostrictive member having a plurality of grooves according to an embodiment, FIG. 1A being an overall image and FIG. 1B being a partially enlarged image of FIG. 1A.
Figure 1B:
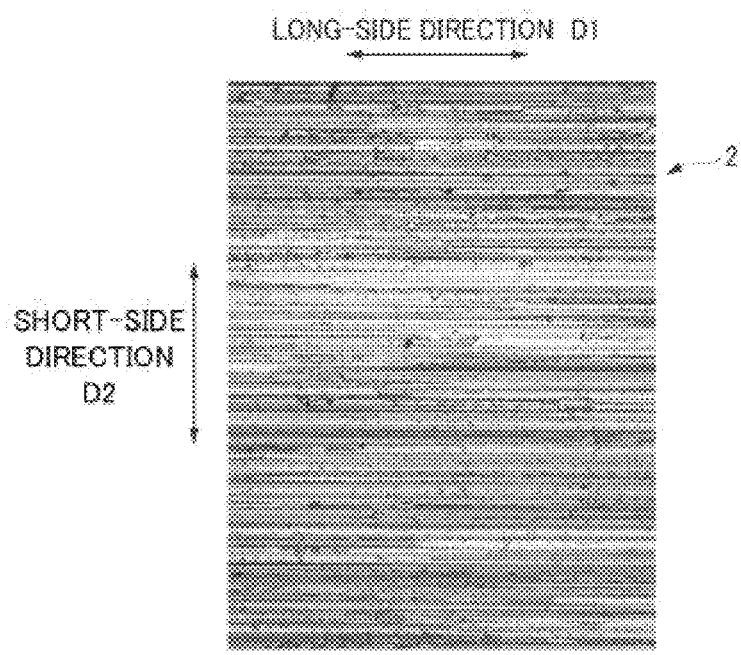

The following describes a magnetostrictive member and a method for manufacturing a magnetostrictive member of the present embodiment. The following first describes the magnetostrictive member of the present embodiment. FIGS. 1A and 1B are diagrams of an example of a magnetostrictive member having a plurality of grooves according to the embodiment. As illustrated in FIGS. 1A and 1B, this magnetostrictive member 1 is a plate-like body having a long-side direction D1 and a short-side direction D2. The plate-like body is a rectangular shape in a plan view. The plate-like body has a front face 3 and a back face 4. The front face 3 and the back face 4 are suitably parallel to each other but are not necessarily parallel to each other.

The magnetostrictive member 1 is formed of a crystal of an iron-based alloy. The iron-based alloy is not limited to a particular alloy so long as it has magnetostrictive characteristics. The magnetostrictive characteristics mean characteristics causing a shape change when a magnetic field is applied. The iron-based alloy is, for example, an alloy such as Fe—Ga, Fe—Ni, Fe—Al, Fe—Co, Tb—Fe, Tb—Dy—Fe, Sm—Fe, or Pd—Fe. The alloys may be alloys with a third component added. The Fe—Ga alloy, for example, may be an alloy with Ba, Cu, or the like added. Among these iron-based alloys, the Fe—Ga alloy has larger magnetostrictive characteristics and is easier to process than other alloys and thus has been applied to materials for vibration power generation in the energy harvesting field, wearable terminals, sensors, and the like. In the following description, an example of a configuration in which the magnetostrictive member 1 is formed of a single crystal of the Fe—Ga alloy will be described as an example of the magnetostrictive member 1.

The single crystal of the Fe—Ga alloy has a body-centered cubic lattice structure and is based on the fact that first to third <100> axes (see FIG. 5 to FIG. 7) of the directional indices in the Miller indices are equivalent and first to third {100} planes (see FIG. 5 to FIG. 7) of the plane indices in the Miller indices are equivalent (i.e., (100), (010), and (001) are equivalent). In addition, the Fe—Ga alloy has the characteristic of exhibiting large magnetic distortion in a specific orientation of the crystal. When this characteristic is used for a magnetostrictive vibration power generation device, it is desirable to match the direction in which the magnetostriction of the magnetostrictive member 1 is required in the device and the orientation (direction) in which the magnetic strain of the crystal is maximum with each other. Specifically, as described above, it is desirable to set the <100> direction, which is the easy direction of magnetization in the single crystal, to the long-side direction D1 of the magnetostrictive member 1. Setting the <100> direction, which is the easy direction of magnetization in the single crystal, to the long-side direction D1 of the magnetostrictive member 1 can be performed, for example, by calculating the crystal orientation of the single crystal by known crystal orientation analysis and cutting the single crystal on the basis of the calculated crystal orientation of the single crystal.

The magnetostrictive member 1 is used, for example, as materials (components) for vibration power generation devices in the energy harvesting field and materials (components) for wearable terminals, sensors, and the like. For example, the magnetostrictive vibration power generation device as disclosed in Patent Literature 5 above includes a coil, an Fe—Ga alloy magnetostrictive member wound by the coil, a yoke, and a field permanent magnet. In this magnetostrictive vibration power generation device, as a mechanism, when the yoke as a movable part of the device is vibrated, the magnetostrictive member fixed at the central part of the yoke vibrates in tandem, the magnetic flux density of the coil wound on the magnetostrictive member changes due to the reverse magnetostriction effect, and electromagnetic induction electromotive force is generated to generate power. When used on such a mechanism, it is suitable that the shape of the magnetostrictive member 1 is like a thin plate and is set to an elongated rectangular shape in a plan view. The thickness of the magnetostrictive member 1 is not limited to a particular thickness. The lower limit of the thickness is suitably 0.3 mm or more, more suitably 0.4 mm or more, and even more suitably 0.5 mm or more. The upper limit of the thickness of the magnetostrictive member 1 is suitably 2 mm or less, more suitably 1.8 mm or less, and even more suitably 1.5 mm or less. The thickness of the magnetostrictive member 1 is suitably 0.3 mm or more and 2 mm or less, more suitably 0.4 mm or more and 1.8 mm or less, and even more suitably 0.5 mm or more and 1.5 mm or less. The mechanism of power generation by the magnetostrictive member 1 is, as described above, a mechanism to generate power by the reverse magnetostriction effect by applying stress to the magnetostrictive member (vibration). When the thickness of the magnetostrictive member 1 is less than 0.3 mm, it is easily damaged during vibration. When the thickness of the magnetostrictive member 1 exceeds 2 mm, on the other hand, the stress due to vibration is required to be increased, resulting in lower efficiency. The shape and the size of the magnetostrictive member 1 are set as appropriate in accordance with the size of an objective device. For example, the size of the magnetostrictive member 1 includes a length (dimension) in the long-side direction D1 of 16 mm, a width (dimension) in the short-side direction D2 of 4 mm, and a thickness of 1 mm.

The shape and the dimensions of the magnetostrictive member 1 are not limited to particular ones. For example, the magnetostrictive member 1 need not be a rectangular shape in a plan view. For example, the shape of the magnetostrictive member 1 may be elliptic, track-shaped, or irregular in a plan view. When the shape of the magnetostrictive member 1 is other than the rectangular shape in a plan view, the long-side direction D1 is a long-diameter direction, a long-axis direction, or the like, whereas the short-side direction D2 is a direction orthogonal to the long-side direction D1.

As described above, the inventors of the present invention produced a plurality of plate-like magnetostrictive members formed of the single crystal of the Fe—Ga alloy, with the {100} plane as the principal plane, and with a rectangular shape in a plan view with the <100> direction, which is the easy direction of magnetization, as the long-side direction of the magnetostrictive member. Checking the magnetostrictive characteristics of the magnetostrictive members produced by being cut out of the single crystal of the Fe—Ga alloy with a uniform Ga concentration revealed that the produced magnetostrictive members had a large variation in the parallel magnetostriction amount, although they had a high-level magnetostriction constant. It was also found out that in these magnetostrictive members, the magnetostriction constant itself might vary and that the magnetostriction constant varied depending on the position at which the magnetostrictive member was cut out of the single crystal. After further examinations, it was also found out that the magnetostriction constant and the parallel magnetostriction amount were related to an inter-lattice distance of the single crystal in each direction. The present invention has been made on the basis of the above findings.

A magnetostrictive member is manufactured, for example, by cutting a grown crystal of an iron-based alloy in a certain direction to produce a thin plate-like member and then cutting the produced thin plate-like member into a predetermined size. Conventional magnetostrictive members have been subjected to polishing or the like on the front and back faces of the magnetostrictive members to finish the front and back faces to be smooth.

As illustrated in FIGS. 1A and 1B, the magnetostrictive member 1 of the present embodiment is formed of a single crystal of an iron-based alloy having magnetostrictive characteristics, is the plate-like body having the long-side direction D1 and the short-side direction D2, and has a lattice constant of a <100> orientation in the short-side direction D2 larger than a lattice constant of a <100> orientation in the long-side direction D1. The following gives a detailed description.

As described above, checking the magnetostrictive characteristics of the magnetostrictive members cut out of the Fe—Ga single crystal with a uniform Ga concentration reveals that they have a variation in the parallel magnetostriction amount and may have a variation in the magnetostriction constant itself, although they have a high-level magnetostriction constant. Given these circumstances, the inventors of the present invention have performed examinations on the magnetostriction constant and the parallel magnetostriction amount of the magnetostrictive member and the inter-lattice distance of the single crystal in each direction to find that they are related to each other.

Figure 2:
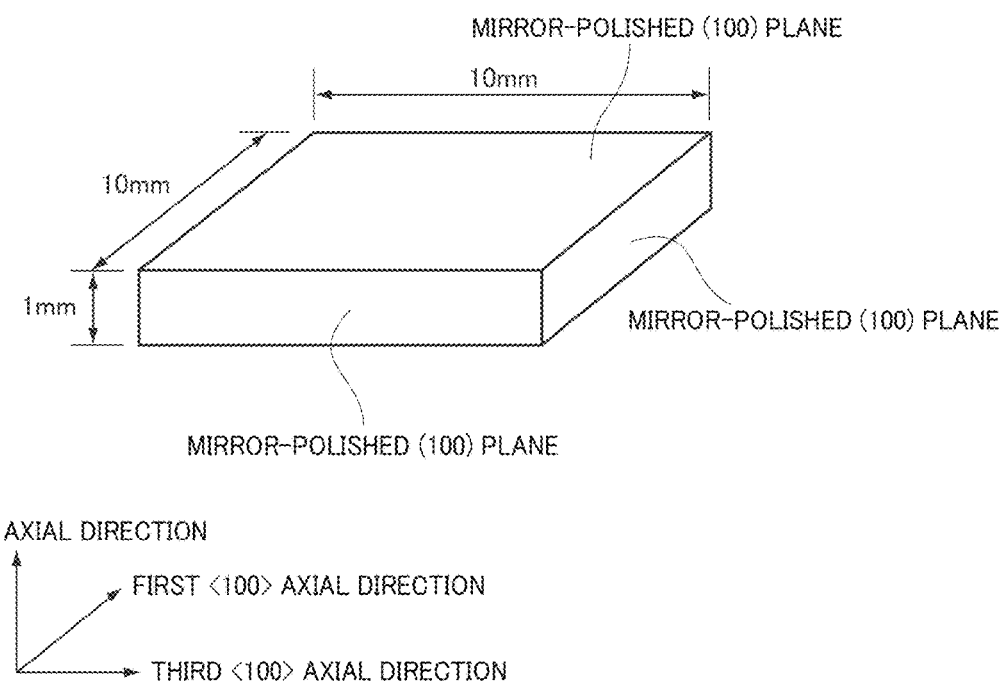
FIG. 2 is a schematic diagram of the magnetostrictive member processed to be 10 mm×10 mm×1 mm such that all six faces are {100} planes and mirror-polished faces.
Figure 5:
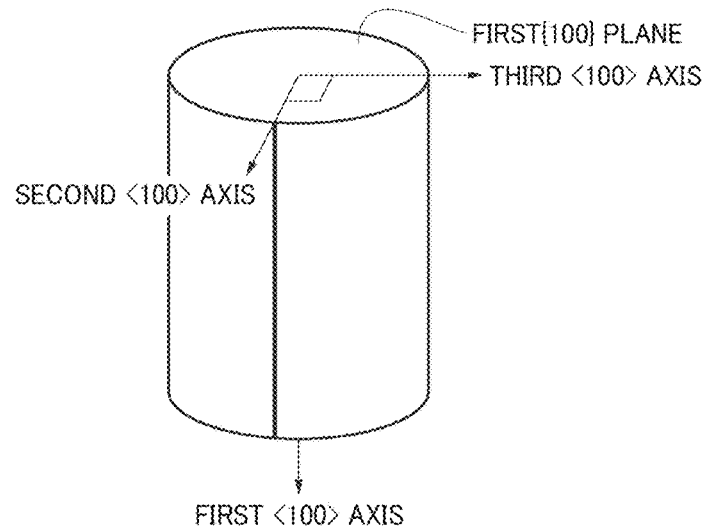
FIG. 5 is a diagram of a first example of a single crystal, a thin plate member, and a magnetostrictive member.
Figure 5:
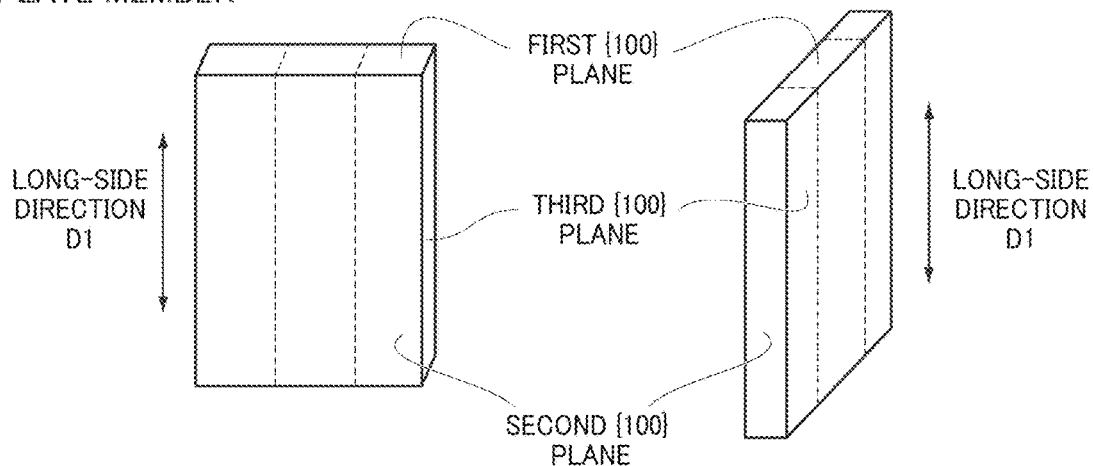
Figure 5:
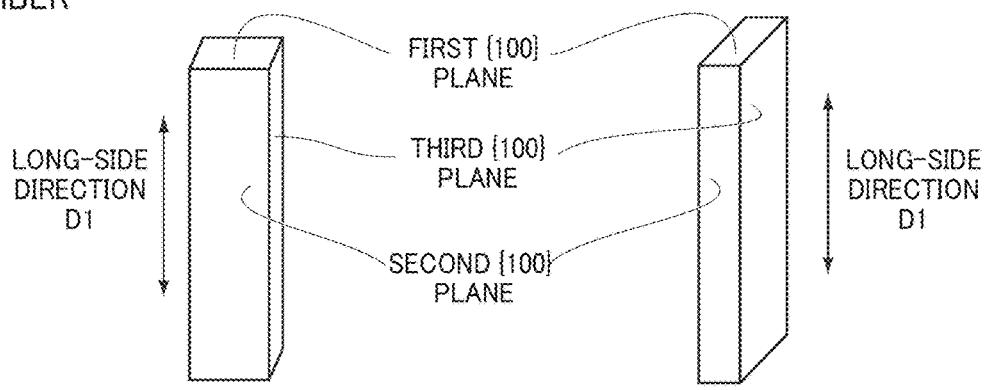

As illustrated in FIG. 5, a thin plate member was cut out of a grown single crystal so as to be parallel to a first <100> axial direction and parallel to a third <100> axial direction to produce a plurality of Samples A to F, which were examined. The production of the samples was performed by the following procedure. The thin plate member was produced by cutting the grown single crystal with a free abrasive grain type multi-wire saw so as to be parallel to the first <100> direction and parallel to the third <100> axial direction, which was cut so as to have a size of 10 mm×10 mm×1 mm illustrated in FIG. 2. Furthermore, the cut thin plate member was mirror polished by 50 μm each per face for each face to make a magnetostrictive member sample.

To evaluate the lattice constants of (100) planes in three directions, for a total of three faces, or the front face and the two side faces, of the magnetostrictive member sample, using the X-ray diffraction of the (100) plane with a two-dimensional X-ray diffractometer (XRD), a (200) diffraction peak was used to measure a diffraction angle 2θ, a d value was calculated from the diffraction angle, and further the d value was doubled to calculate the lattice constant. As a result, it was confirmed that the lattice constants in the three directions were not constant and asymmetric. It has been conventionally thought that the first to third <100> axes of the directional indices in the Miller indices are equivalent because Fe—Ga alloys have a body-centered cubic lattice structure. However, in the crystals actually grown, it has been found that there are differences in the lattice constants in the three directions, or the first to third <100> axial directions (hereinafter also abbreviated as "lattice constants in the three directions"). Furthermore, it has been found that there are differences in a lattice constant trend even among samples in the same thin plate member of the same crystal. Table 1 lists detailed results. It is thought from these results that the variation in the lattice constant is the cause of the variation in the magnetostrictive characteristics. In the present specification, for the average of the lattice constants in the three directions, the volume of a unit lattice with the lattice constants in the three directions multiplied is equivalent regardless of the crystal site, and thus the value that is the cubic root of the volume of the unit lattice is defined as the average of the lattice constants.

Next, for Samples A to F, a strain gauge was attached to the surface of the magnetostrictive member sample to measure the magnetostriction constant and the parallel magnetostriction amount in the growth axis direction and the third <100> axial direction. Table 1 lists the results. The measurement of the magnetostriction constant and the parallel magnetostriction amount was performed in the same manner as in Example 1 described below.

TABLE 1

| | Lattice constant (Å) | | | | Magnetostriction amount in first axial direction | | | Magnetostriction amount in third axial direction | | |
| --- | --- | --- | --- | --- | --- | --- | --- | --- | --- | --- |
| | First axial direction (growth direction) | Third axial direction | Second axial direction (thickness direction) | Average | Magnetostriction constant (ppm) | Parallel magnetostriction amount (ppm) | Ratio | Magnetostriction constant (ppm) | Parallel magnetostriction amount (ppm) | Ratio |
| Sample A | 2.9035 | 2.9032 | 2.9042 | 2.9036 | 284 | 257 | 90% | 283 | 282 | 100% |
| Sample B | 2.9030 | 2.9026 | 2.9037 | 2.9031 | 292 | 241 | 83% | 290 | 279 | 96% |
| Sample C | 2.9021 | 2.9036 | 2.9038 | 2.9032 | 286 | 282 | 99% | 295 | 160 | 54% |
| Sample D | 2.9020 | 2.9038 | 2.9031 | 2.9030 | 297 | 295 | 99% | 299 | 13 | 4% |
| Sample E | 2.9030 | 2.9033 | 2.9043 | 2.9035 | 288 | 281 | 98% | 301 | 281 | 93% |
| Sample F | 2.9017 | 2.9029 | 2.9040 | 2.9029 | 291 | 284 | 98% | 288 | 280 | 97% |

As can be seen from Table 1, it can be seen that there are differences in the magnitude of the lattice constants in the respective axial directions of the magnetostrictive member in the samples obtained by processing the grown crystal into the thin plate member and then into magnetostrictive members. In Sample A and Sample B, there is a tendency that the lattice constant in the third <100> axial direction is smaller and the lattice constant in the thickness direction (the second <100> axial direction) is larger. In Sample C, Sample E, and Sample F, there is a tendency that the lattice constant in the first <100> axial direction (the growth axis direction) is smaller and the lattice constant in the thickness direction (the second <100> axial direction) is larger. In Sample D, there is a tendency that the lattice constant in the first <100> axial direction (the growth axis direction) is smaller and the lattice constant in the third <100> axial direction is larger. For the samples as a whole, there is a tendency that the maximum lattice constant is in the second <100> axial direction.

When the magnetostrictive characteristics of these samples are compared between the first <100> axial direction (the growth axis direction) and the third <100> axial direction, in Sample A and Sample B, there is no significant difference in the magnetostriction constant, but there is a tendency in the parallel magnetostriction amount that the parallel magnetostriction amount in the third <100> axial direction is slightly larger than that in the first <100> axial direction. In Sample C, there is a tendency in the parallel magnetostriction amount that the parallel magnetostriction amount in the first <100> axial direction is larger than that in the third <100> axial direction. In Sample E and Sample F, as to the parallel magnetostriction amount, the parallel magnetostriction amounts in the first <100> axial direction and the third <100> axial direction were comparable at a high level. In sample D, it can be seen that the parallel magnetostriction amount in the first <100> axial direction is at a high level, but the parallel magnetostriction amount in the third <100> axial direction is at an extremely low level.

From the above results, there is a relation between the lattice constant and the magnetostrictive characteristics, and from the results of Sample D and Sample C, there is a tendency that when the direction with a larger lattice constant is the direction of measuring the parallel magnetostriction amount, the parallel magnetostriction amount is smaller. On the other hand, it can be seen that there is a tendency that when the direction with a smaller lattice constant than an average of the lattice constants in the respective directions is the direction of measuring the parallel magnetostriction amount, the parallel magnetostriction amount is stable at a high level. In particular, it can be seen that by making the direction with the minimum value among the lattice constants in the respective directions the direction of measuring the parallel magnetostriction amount, the parallel magnetostriction amount is stable at a high level.

The magnetostrictive member is rectangular in a plan view and has a long-side direction and a short-side direction. In general, the magnetostrictive member changes its magnetostriction amount by applying deformation in this long-side direction. Thus, the magnetostriction amount is suitably set so as to be maximum in the long-side direction of the magnetostrictive member. As described above, checking with the samples extracted from the same single crystal reveals that the magnetostrictive characteristics are larger in the direction parallel to the direction in which the lattice constant of the magnetostrictive member is smaller. However, even in crystals grown under the same conditions, there are variations in the lattice constants in the respective directions. Given these circumstances, whether this lattice constant trend can be aligned in the same direction has been further studied to confirm that the lattice constant trend is aligned in the same direction by providing a plurality of grooves to the surface of the magnetostrictive member in the same direction (for example, making the surface a ground face or a one-direction processed face).

The following describes an example in which a plurality of grooves are formed in the magnetostrictive member in the long-side direction of the magnetostrictive member to align the lattice constant in the same direction and to modify the magnetostrictive characteristics.

Figure 3A:
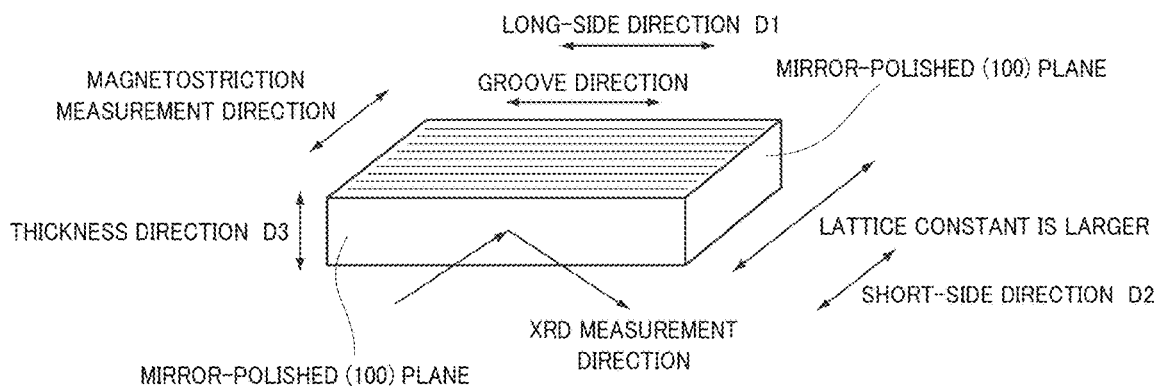
FIGS. 3A and 3B are schematic diagrams of the magnetostrictive member formed with the grooves according to the embodiment, showing a relation among a groove direction, a parallel magnetostriction amount, and a lattice constant for the magnetostrictive member.
Figure 3B:
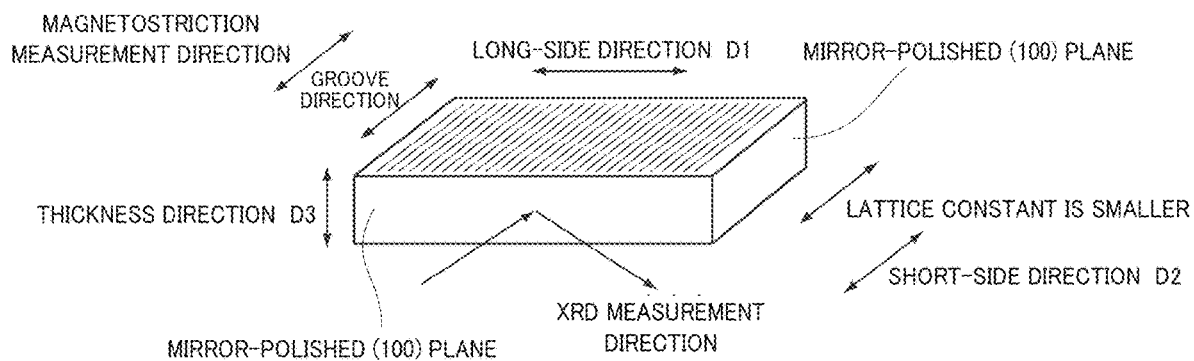

In the present embodiment, as shown in examples and comparative examples described below, in the magnetostrictive member, a plurality of grooves 2 are formed on both the front and back faces of the magnetostrictive member, and changes in the lattice constant, the magnetostriction constant, and the parallel magnetostriction amount of the magnetostrictive member in each of the long-side direction and the short-side direction were examined before and after forming the grooves. In the present embodiment, the lattice constant, the magnetostriction constant, and the parallel magnetostriction amount in each of the long-side direction and the short-side direction of the magnetostrictive member were measured when the grooves 2 extending in the same direction as the long-side direction D1 were formed in the magnetostrictive member (Example 1) and when the grooves 2 extending in the same direction as the short-side direction D2 were formed (Comparative Example 1). Tables 2 and 3 and Tables 8 and 9 list the results. For the lattice constant before forming the grooves 2, varying magnetostrictive members were used, including Examples 1-2 and 1-3, in which the lattice constant in the short-side direction was minimum, whereas the lattice constant in the long-side direction was maximum, and Examples 1-1, 1-4, and 1-5, in which the lattice constant in the short-side direction was minimum, whereas the lattice constant in the thickness direction was maximum. In these magnetostrictive members, when the grooves 2 extending in a direction parallel to the long-side direction D1 are formed in the magnetostrictive member as illustrated in FIG. 3A, by forming the grooves 2, the lattice constant in the long-side direction D1 was minimum, whereas the lattice constant in the short-side direction D2 was larger than the lattice constant in the long-side direction D1. In particular, the lattice constants in the long-side direction before forming the grooves 2 varied, but it was confirmed that by forming the grooves 2 extending parallel to the long-side direction D1, the directions in which the lattice constants were minimum were all aligned in the same direction (the long-side direction D1 in this example). It is considered that the formation of the groove 2 increased the surface roughness in a direction perpendicular to the grooves 2 (a perpendicular direction), thereby generating large tensile stress in the direction perpendicular to the grooves 2 and increasing the lattice constant in the same direction. In the direction parallel to the grooves 2, the lattice constant was relatively small. In Comparative Example 1, a plurality of grooves 2 were formed as in Example 1, in which the direction of formation of the grooves 2 was in the short-side direction D2 as illustrated in FIG. 3B. As in Example 1 described above, the lattice constants in the long-side direction before forming the grooves 2 varied, but it was confirmed that by forming the grooves 2 extending parallel to the short-side direction D2, the directions in which the lattice constants were minimum were all aligned in the same direction (the short-side direction D2 in this example). Thus, by forming the grooves 2, it is possible to align the directions in which the lattice constants are minimum in the direction parallel to the direction in which the grooves 2 are formed.

For the lattice constants in the present embodiment, XRD cannot be used on the face on which the grooves 2 are formed (the face in which the lattice constant in the thickness direction is measured), and thus the lattice constants for two <100> directions in the mirror-polished side face direction were evaluated.

As described above, the magnetostriction constant and the parallel magnetostriction amount are affected by the magnitude of the lattice constant of the magnetostrictive member 1. By making the lattice constant of the magnetostrictive member in the short-side direction larger than the lattice constant in the long-side direction, the parallel magnetostriction amount can be made stable at a high level. In Example 1, the lattice constant in the short-side direction D2 is larger than the lattice constant in the long-side direction D1, and it can be seen that both the magnetostriction constant and the parallel magnetostriction amount are stable at a high level. In Comparative Example 1, by making the lattice constant of the magnetostrictive member in the long-side direction D1 larger than the lattice constant in the short-side direction D2, the parallel magnetostriction amount is overall smaller and is less than 50% or less of the magnetostriction constant, which is undesirable. Thus, by aligning the lattice constant of the magnetostrictive member in the short-side direction to be larger than the lattice constant in the long-side direction, both the parallel magnetostriction amount are modified (corrected) to be a high level and have small variations among members.

The difference between the lattice constant in the long-side direction D1 and the lattice constant in the short-side direction D2 suitably has a difference of 0.0008 Å or more, more suitably 0.0010 Å or more, more suitably 0.0015 Å or more, and more suitably 0.0017 Å or more and suitably has a difference of 300 ppm or more, more suitably a difference of 400 ppm or more, more suitably a difference of 500 ppm or more, more suitably a difference of 600 ppm or more, and more suitably a difference of 700 ppm or more in terms of ppm. A larger difference between the lattice constant in the long-side direction D1 and the lattice constant in the short-side direction D2 makes the above effect of improvement in the magnetostrictive characteristics greater. In particular, the parallel magnetostriction amount can be maintained at 90% or more of the magnetostriction constant and is stable at a high level.

The parallel magnetostriction amount is a magnetostriction amount when a magnetic field parallel to the long-side direction D1 of the magnetostrictive member 1 is applied and the magnetostriction amount in the long-side direction D1 is saturated. The perpendicular magnetostriction amount is a magnetostriction amount when a magnetic field parallel to the short-side direction D2 of the magnetostrictive member 1 is applied and the magnetostriction amount in the short-side direction D2 is saturated.

The magnetostriction constant, the parallel magnetostriction amount, and the perpendicular magnetostriction amount in the magnetostrictive member 1 of the present embodiment are values determined as described in the examples to be explained later. The magnetostriction amounts are values determined by correcting an actual strain detection value by a gauge factor in accordance with Expression (3), in which the magnetostriction amount when the magnetic field direction is parallel to the long-side direction of a strain gauge is defined as the parallel magnetostriction amount, whereas the magnetostriction amount when the magnetic field direction is perpendicular to the long-side direction of the strain gauge is defined as the perpendicular magnetostriction amount. The magnetostriction constant is a value determined by the difference between the parallel magnetostriction amount and the perpendicular magnetostriction amount in accordance with Expression (1). The angle between the direction of extension of the grooves 2 and the long-side direction D1 is a value obtained by averaging values of a plurality of different grooves. The lattice constant in the magnetostrictive member 1 of the present embodiment is also a value obtained as described in the examples to be explained later.

The following describes the grooves 2. The grooves 2 are formed on at least one of the front face 3 and the back face 4. In the example illustrated in FIGS. 1A and 1B, the grooves 2 are formed on both the front face 3 and the back face 4. When the grooves 2 are formed on one of the front face 3 and the back face 4, there is a tendency that the effect of aligning the lattice constant is less effective and variations in the magnetostrictive characteristics are larger than those of the case in which the grooves 2 are formed on both the front face 3 and the back face 4, and thus the grooves 2 are suitably formed on both the front face 3 and the back face 4.

The grooves 2 are formed so as to extend in the long-side direction D1. Each of the grooves 2 is linear (striated). Each of the grooves 2 is suitably straight from the viewpoint of efficiently expressing the effect of the modification of the magnetostriction constant and the parallel magnetostriction amount described above. Each of the grooves 2 may be curved. The length of each of the grooves 2 in the long-side direction D1 is not limited to a particular length. The grooves 2 are suitably formed uniformly within the plane at predetermined intervals in the short-side direction D2 and are suitably formed throughout the entire plane from the viewpoint of efficiently expressing the effect of the modification of the magnetostriction constant and the parallel magnetostriction amount described above.

As to the direction in which the grooves 2 are formed with respect to the long-side direction D1 of the magnetostrictive member 1, the direction in which the grooves 2 extend and the long-side direction D1 are suitably the same direction. Still, so long as the lattice constant of the magnetostrictive member 1 in the short-side direction D2 is larger than the lattice constant in the long-side direction D1, the direction in which the grooves 2 extend and the long-side direction D1 are not necessarily the same direction, and an angle may be formed between the direction in which the grooves 2 extend and the long-side direction D1. There is a tendency that as the angle between the direction in which the grooves 2 extend and the long-side direction D1 increases, the lattice constant characteristics come close to the lattice constant characteristics when the grooves 2 extending in the same direction as the short-side direction D2 are formed, and thus this angle (the angle between the direction in which the grooves 2 extend and the long-side direction D1) is suitably less than 40° and more suitably within 30°. When the angle is in the above suitable range, the effect of the modification of the lattice constant, the magnetostriction constant, and the parallel magnetostriction amount is expressed more reliably.

The grooves 2 illustrated in FIG. 1B can be formed, for example, by performing one-direction processing on at least one of the front face 3 and the back face 4 of a thin plate member obtained by cutting a single crystal. That is, the magnetostrictive member 1 of the present embodiment may have a one-direction processed face. Here, the one-direction processing means processing including processing in which the direction of the processing on a workpiece is one direction. One direction means a linear direction including a single direction and a reciprocating direction and is a direction including a straight direction and a curved direction. In the present embodiment, one direction in the one-direction processing is suitably a straight direction. The one-direction processed face means the face of a workpiece on which the one-direction processing has been performed. Examples of the one-direction processing to be applied to the thin plate member described above include surface grinding and wire saw processing. In the case of surface grinding, the grooves 2 are grinding marks (grinding striations) formed on the processed face (the one-direction processed face) on which the surface grinding has been performed. The grinding marks are marks formed by a grinding wheel during the surface grinding. These grinding marks are marks formed in a striated manner (a linear manner) along a grinding direction (the moving direction of the grinding wheel or the moving direction of a processing table) in the surface grinding. The direction of the grinding marks (the direction of extension of the grooves 2) can be controlled by controlling the grinding direction. The grinding marks can be controlled by the grain size (grit) of the grinding wheel. The condition of the grooves 2 formed by the surface grinding can be checked with a microscope or the like. The method for forming the grooves 2 is not limited to the surface grinding as will be described later. The grooves 2 may include grooves extending in different directions and include grooves of shapes with different lengths or depths.

As to a surface roughness Ra of the face formed with the grooves 2, the surface roughness Ra in the long-side direction D1 is usually smaller than the surface roughness Ra in the short-side direction D2. The grooves 2 are formed in a linear manner (a striated manner) so as to extend in the long-side direction D1. Thus, the short-side direction D2 of the magnetostrictive member 1 has an uneven shape, and thus the surface roughness Ra is larger than that in the long-side direction D1. The long-side direction D1 of the magnetostrictive member 1 follows the linear (striated) grooves 2 extending in the long-side direction D1, and thus the surface roughness Ra is smaller than that in the short-side direction D2. In the present embodiment, the surface roughness Ra is a value obtained by averaging values measured on a plurality of different parts in one magnetostrictive member 1.

On the face formed with the grooves 2, the surface roughness Ra in the long-side direction D1 is smaller than the surface roughness Ra in the short-side direction D2. On the face formed with the grooves 2, the surface roughness Ra in the long-side direction D1 has a lower limit of suitably 0.3 µm or more, has an upper limit of suitably 1.5 µm or less, and is more suitably 0.3 µm or more and 1.5 µm or less. On the face formed with the grooves 2, the surface roughness Ra in the short-side direction D2 has a lower limit of suitably 0.6 µm or more and more suitably 0.7 µm or more, has an upper limit of suitably 4.5 µm or less, and has a range of suitably 0.6 µm or more and 4.5 µm or less and more suitably 0.7 µm or more and 4.5 µm or less. When the surface roughness Ra in the long-side direction D1 or the short-side direction D2 on the face formed with the grooves 2 is in any of the above ranges, the effect of the modification of the lattice constant, the magnetostriction constant, and the parallel magnetostriction amount can be efficiently expressed.

The following describes the characteristics of the magnetostrictive member 1 of the present embodiment. The magnetostrictive member 1 of the present embodiment can have a magnetostriction constant of 200 ppm or more and suitably 250 ppm or more by the above configuration. The magnetostrictive member 1 can have a parallel magnetostriction amount of 200 ppm or more and suitably 250 ppm or more by the above configuration. When the magnetostriction constant and the parallel magnetostriction amount of the magnetostrictive member 1 are in the above ranges, the magnetostrictive member 1 is suitably formed of a single crystal of an Fe—Ga alloy. The ratio (%) indicating the magnetostriction constant/the parallel magnetostriction amount can be 90% or more and more suitably 95% or more as shown in Examples 1 to 5, for example.

In the magnetostrictive member 1 of the present embodiment, by forming the grooves 2 extending in the long-side direction D1 on at least one of the front face 3 and the back face 4 of the magnetostrictive member, the lattice constants varied among the respective directions before processing, but as to the lattice constant, the lattice constant of the <100> orientation in the short-side direction is made larger than the lattice constant of the <100> orientation in the long-side direction and made uniform, and thus both the magnetostriction constant and the parallel magnetostriction amount are modified (corrected) to be a high level and have small variations among members. Thus, the magnetostrictive member 1 of the present embodiment, in the case of a plurality of magnetostrictive members 1 manufactured from one crystal, can make a variation in the magnetostriction constant within 15% and a variation in the parallel magnetostriction amount within 10% among the magnetostrictive members 1. The magnetostrictive member 1 of the present embodiment, in the case of a plurality of magnetostrictive members 1 manufactured from one crystal, can make the variation coefficient of the magnetostriction constant suitably 0.1 or less and more suitably 0.06 or less and make the variation coefficient of the parallel magnetostriction amount suitably 0.1 or less and more suitably 0.05 or less among the magnetostrictive members 1. In the present embodiment, the variation in the magnetostriction constant and the parallel magnetostriction amount among the magnetostrictive members 1 is a value calculated by Expression (2) below.

Variation (%)=|Difference between average and largest outlier|/Average     Expression (2)

The grown one crystal is an effective crystal used as the magnetostrictive member (part actually used as a component) out of the grown crystal. For example, it is a range with a solidification rate of 10% to 85% for a crystal grown by the BV method and a range with a uniform diameter (part excluding a grown shoulder part and the like) for a crystal grown by the CZ method.

As described above, by providing a plurality of grooves to the surface of the magnetostrictive member, the lattice constant can be aligned in one direction, and consequently, magnetostrictive members having the lattice constant of the <100> orientation in the short-side direction larger than the lattice constant of the <100> orientation in the long-side direction can be produced stably.

The magnetostrictive member of the present embodiment is not limited to providing a plurality of grooves to the surface of the magnetostrictive member so long as it is possible to align the lattice constant in one direction. It may be a method of processing to form tensile processing stress in the short-side direction on the surface of the magnetostrictive member, and by adjusting the tensile processing stress to be formed, the magnetostrictive member of the present embodiment can be obtained. For example, instead of surface grinding, the same effect can be achieved by slicing with a fixed abrasive grain type multi-wire saw. By making a wire traveling direction the long-side direction, the tensile processing stress can be formed in the short-side direction D2.

As described above, the magnetostrictive member 1 of the present embodiment is a magnetostrictive member formed of a single crystal of an iron-based alloy having magnetostrictive characteristics, being a plate-like body having the long-side direction D1 and the short-side direction D2, and having a lattice constant of a <100> orientation in the short-side direction D2 larger than a lattice constant of a <100> orientation in the long-side direction. For example, in the magnetostrictive member 1 of the present embodiment, the lattice constant of the <100> orientation in the short-side direction D2 can be the values shown in Examples 1 to 5, which can be 2.9038 Å to 2.9056 Å, 2.9038 Å or more, 2.9042 Å or more, 2.9045 Å or more, and 2.9050 Å or more. For example, in the magnetostrictive member 1 of the present embodiment, the lattice constant of the <100> orientation in the long-side direction D1 can be the values shown in Examples 1 to 5, which can be 2.9024 to 2.9034 Å, 2.9034 Å or less, 2.9030 Å or less, and 2.9025 Å or less.

As listed in Tables 1 to 9, by making the lattice constant of the <100> orientation in the short-side direction larger than the lattice constant of the <100> orientation in the long-side direction, the magnetostriction constant and the parallel magnetostriction amount can be stabilized. The magnetostrictive member 1 of the present embodiment can be manufactured by processing a single crystal into a thin plate member and then measuring the lattice constant or estimating the lattice constant from values measured in the past to extract the magnetostrictive member 1 having the lattice constant of the <100> orientation in the short-side direction larger than the lattice constant of the <100> orientation in the long-side direction. The magnetostrictive member 1 of the present embodiment does not necessarily include the grooves 2 described above if the lattice constant of the <100> orientation in the short-side direction is larger than the lattice constant of the <100> orientation in the long-side direction and the parallel magnetostriction amount in the long-side direction is 200 ppm or more.

As described above, the magnetostrictive member 1 of the present embodiment is formed of a crystal of an iron-based alloy having magnetostrictive characteristics, is a plate-like body having a long-side direction and the short-side direction, and has a lattice constant of a <100> orientation in the short-side direction larger than a lattice constant of a <100> orientation in the long-side direction. In the magnetostrictive member 1 of the present embodiment, any configuration other than the above is optional. The magnetostrictive member 1 of the present embodiment has the characteristics of a high magnetostriction constant and a high parallel magnetostriction amount and small variations in the magnetostriction constant and the parallel magnetostriction amount among members. In the magnetostrictive member 1 of the present embodiment, variations in the magnetostriction constant and the parallel magnetostriction amount in conventional magnetostrictive members manufactured from the same single crystal are reduced, and thus it can be produced stably with high yield. The magnetostrictive member 1 of the present embodiment has a high magnetostriction constant and a high parallel magnetostriction amount and thus can be suitably used as an end product of a member (material) exhibiting excellent magnetostriction and reverse magnetostriction effects.

The following describes a method for manufacturing a magnetostrictive member of the present embodiment. The method for manufacturing a magnetostrictive member of the present embodiment is an example of a method for manufacturing the magnetostrictive member 1 of the present embodiment described above. The method for manufacturing a magnetostrictive member of the present embodiment includes acquiring a plate-like body formed of a crystal of an iron-based alloy having magnetostrictive characteristics, having the long-side direction D1 and the short-side direction D2, and having a lattice constant of a <100> orientation in the short-side direction larger than a lattice constant of a <100> orientation in the long-side direction. For example, the method for manufacturing a magnetostrictive member of the present embodiment includes forming the grooves 2 extending in the long-side direction D1 on at least one of the front face 3 and the back face 4 of the plate-like body formed of a crystal of an iron-based alloy having magnetostrictive characteristics and having the long-side direction D1 and the short-side direction D2 to make the lattice constant of the <100> orientation in the short-side direction larger than the lattice constant of the <100> orientation in the long-side direction. In the following description, a method for manufacturing the magnetostrictive member 1 from a single crystal ingot of an Fe—Ga alloy will be described as an example, but the method for manufacturing a magnetostrictive member of the present embodiment is not limited to the following description. It is assumed that any description in the present specification that is applicable to the method for manufacturing the magnetostrictive member of the present embodiment is also applicable to the method for manufacturing a magnetostrictive member of the present embodiment.

Figure 4:
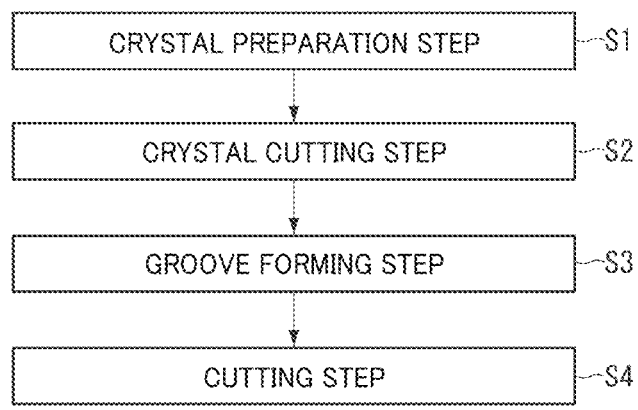
FIG. 4 is a flowchart of an example of a method for manufacturing a magnetostrictive member according to the embodiment.
Figure 6:
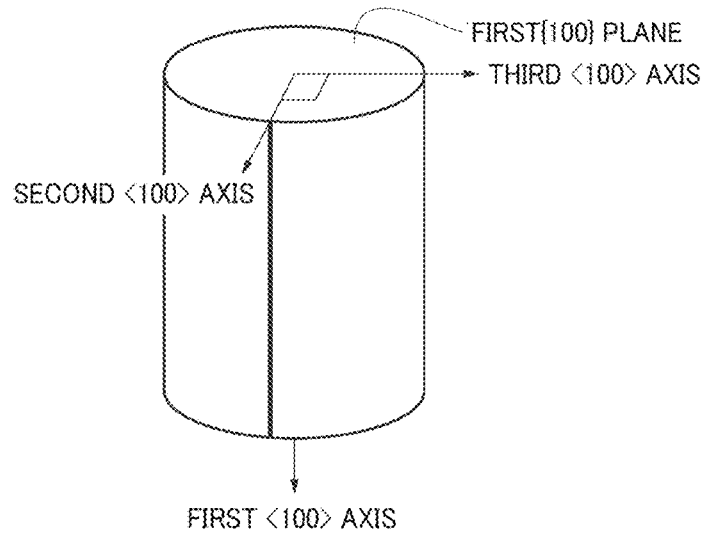
FIG. 6 is a diagram of a second example of the single crystal, the thin plate member, and the magnetostrictive member.
Figure 6:
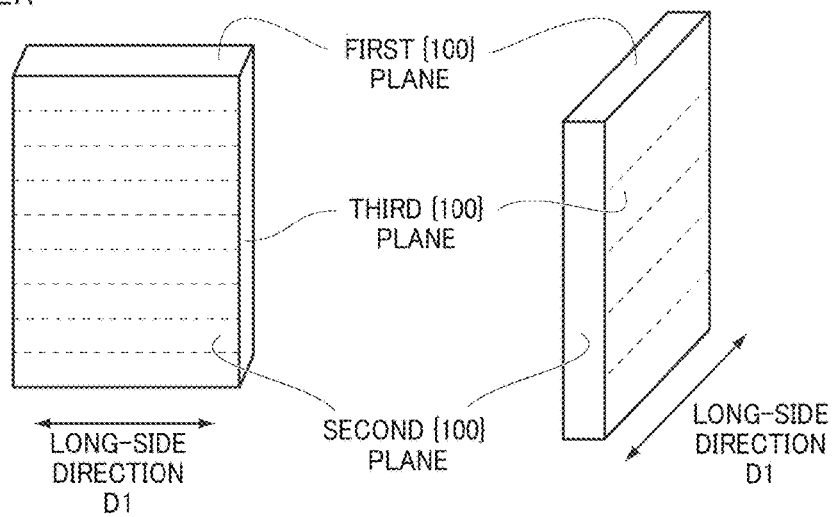
Figure 6:
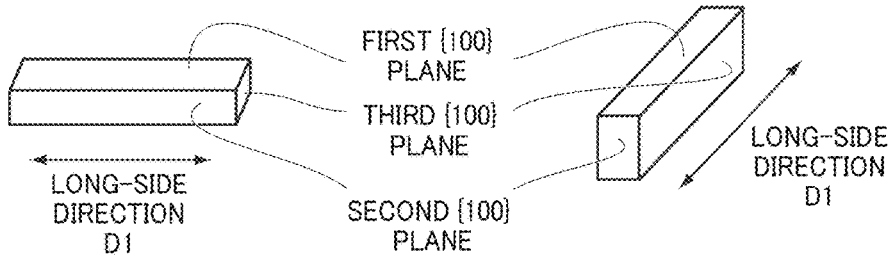
Figure 7:
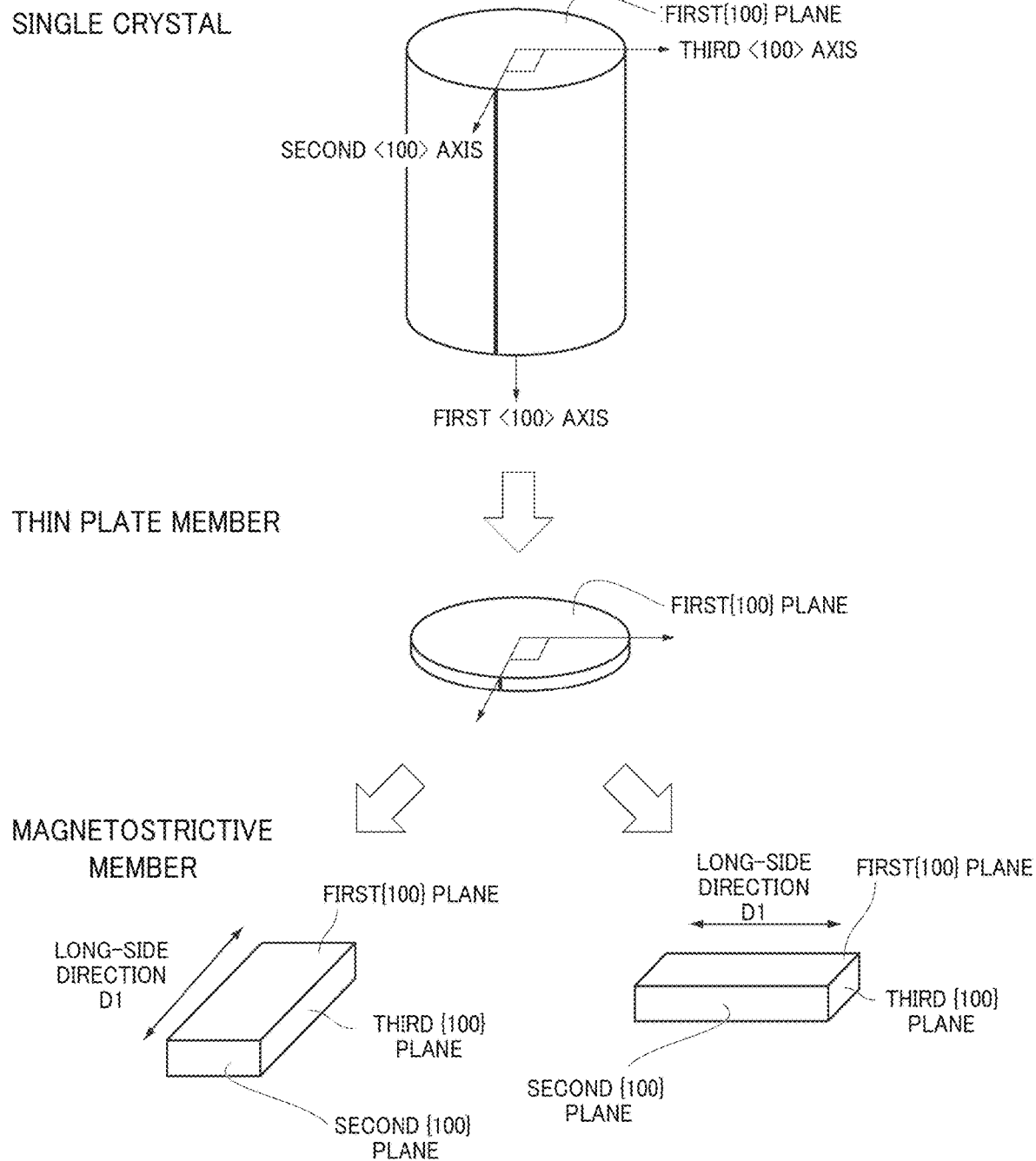
FIG. 7 is a diagram of a third example of the single crystal, the thin plate member, and the magnetostrictive member.

FIG. 4 is a flowchart of an example of the method for manufacturing a magnetostrictive member of the present embodiment. FIG. 5 to FIG. 7 are diagrams of first to third examples of a single crystal, a thin plate member, and a magnetostrictive member. This method for manufacturing a magnetostrictive member of the present embodiment includes a crystal preparation step (Step S1), a crystal cutting step (Step S2), a groove forming step (Step S3), and a cutting step (Step S4).

In the method for manufacturing a magnetostrictive member of the present embodiment, first, in the crystal preparation step (Step S1), a single crystal of an iron-based alloy having magnetostrictive characteristics is prepared. The single crystal to be prepared may be a grown one or a commercially available one. For example, in the crystal preparation step, a single crystal of an Fe—Ga alloy is prepared. The method for growing the single crystal of the Fe—Ga alloy is not limited to a particular method. The method for growing the single crystal of the Fe—Ga alloy may be, for example, the pull-up method or the unidirectional solidification method. For example, the Cz method can be used as the pull-up method, and the VB method, the VGF method, the micro pull-down method, and the like can be used as the unidirectional solidification method.

For the single crystal of the Fe—Ga alloy, the magnetostriction constant is maximized by setting the content of gallium to 18.5 at % or 27.5 at %. For this reason, the single crystal of the Fe—Ga is grown so as to have the content of gallium of suitably 16.0 to 20.0 at % or 25.0 to 29.0 at % and more suitably 17.0 to 19 at % or 26.0 to 28.0 at %. The shape of the grown single crystal is not limited to a particular shape and may be cylindrical or quadrangular prismatic, for example. The grown single crystal may be made into a cylindrical single crystal by cutting a seed crystal, a diameter-increased part, a shoulder part (a part with an increased diameter from the seed crystal to a predetermined single crystal), or the like with a cutting apparatus, if necessary. The size of the single crystal to be grown is not limited to a particular size so long as it is large enough to ensure the magnetostrictive member in a predetermined direction. When the Fe—Ga single crystal is grown, it is grown using a seed crystal processed with the upper face or the lower face of the seed crystal to be the {100} plane so that the growth axis direction is <100>. In the Fe—Ga alloy single crystal to be grown, the crystal is grown in a direction perpendicular to the upper face or the lower face of the seed crystal, and the orientation of the seed crystal is inherited.

Following the crystal preparation step (Step S1), the crystal cutting step (Step S2) is performed. The crystal cutting step is a step cutting the crystal to produce a thin plate member. The thin plate member is a member to be the material of the magnetostrictive member 1 of the present embodiment. The crystal cutting step is a step, for example, cutting the single crystal of the Fe—Ga alloy having magnetostrictive characteristics using a cutting apparatus to produce the thin plate member with the {100} plane as its principal plane. As the cutting apparatus, a cutting apparatus such as a wire electric discharge machine, an inner peripheral blade cutting apparatus, or a wire saw can be used. Among these, the use of a multi-wire saw is particularly suitable because it can cut a plurality of thin plate members at the same time. The cutting direction of the single crystal in the case of the Fe—Ga single crystal is <100>, and cutting is performed such that a cut plane, that is, the principal plane of the thin plate member is the {100} plane. The cutting direction of the single crystal is not limited to a particular direction. The cutting direction of the single crystal may be a perpendicular direction or a parallel direction with respect to the growing direction of the single crystal (the direction in which the crystal is grown) as illustrated in FIG. 5 to FIG. 7, for example.

Following the crystal cutting step (Step S2), the groove forming step (Step S3) is performed. The groove forming step forms the grooves 2 on at least one of the front face 3 and the back face 4 of the obtained thin plate member. In the groove forming step, the grooves 2 are formed in the thin plate member such that when the thin plate member is finally cut and made into the magnetostrictive member 1, the grooves 2 extending in the long-side direction D1 of the magnetostrictive member 1 are formed. As described above, the grooves 2 can be formed by performing the surface grinding on at least one of the front and back faces of the thin plate member obtained by the crystal cutting step. The following describes an example in which the groove forming step is performed by the surface grinding on the thin plate member. When the grooves 2 are formed by the surface grinding, the effect of the modification of the magnetostriction constant and the parallel magnetostriction amount can be efficiently expressed.

The surface grinding is performed using a surface grinder. From the viewpoint of efficiently expressing the effect of the modification of the magnetostriction constant and the parallel magnetostriction amount, the surface grinding is suitably performed such that the direction of the grinding marks formed on the thin plate member is a direction parallel to the long-side direction D1 of the magnetostrictive member 1. For this reason, the grinding marks are suitably straight. To make the grinding marks straight, the surface grinder is suitably of a type in which the moving direction of a grinding wheel or a processing table is straight, and the surface grinder of a type including a flat grinding wheel and in which the processing table reciprocates is suitably used. The surface grinder including a cup grinding wheel and in which the processing table rotates can also be used, but when using such a surface grinder, the grinding marks are curved, and thus it is suitable to set the curvature of the grinding marks to be small (less curved).

The grinding marks are required to be formed on the surface of the magnetostrictive member 1. For this reason, when processing is performed by thickness adjustment or the like of the thin plate member, the surface grinding may be performed after predetermined processing is performed with a processing machine other than the surface grinder such as a double-sided lapping apparatus or a surface grinder including a cup grinding wheel or the like. The surface of the thin plate member (the magnetostrictive member) may be finished to be a mirror surface by performing polishing as in a conventional manner, followed by the surface grinding. From the viewpoint of efficiently expressing the effect of the modification of the magnetostriction constant and the parallel magnetostriction amount, the surface grinding is suitably performed on both the front and back faces of the thin plate member.

The grinding wheel used for the surface grinding has a lower limit of the roughness (grit) of the grinding wheel of suitably #40 or more and more suitably #100 or more, has an upper limit of suitably #500 or less and more suitably #400 or less, and has a range of suitably #40 or more and #500 or less, more suitably #40 or more and #400 or less, and more suitably #100 or more and #400 or less, for example. When the roughness (grit) of the grinding wheel is in any of the above ranges, the effect of the modification of the magnetostriction constant and the parallel magnetostriction amount can be more reliably demonstrated. Note that if a grinding wheel smaller than #40 is used, the size of the grinding marks is not necessarily stabilized. If a grinding wheel exceeding #500 is used, the surface of the magnetostrictive member may become smooth and the effect of the modification of the lattice constant, the magnetostriction constant, and the parallel magnetostriction amount may not be efficiently expressed.

In the groove forming step, as described above, the grooves 2 are suitably formed in the magnetostrictive member 1 such that the surface roughness Ra of the face formed with the grooves 2 in the long-side direction D1 is in any of the suitable ranges described above. For example, the grooves 2 are formed so as to have a lower limit of suitably 0.2 μm or more, an upper limit of suitably 1.5 μm or less, and a range of suitably 0.2 μm or more and 1.5 μm or less. The grooves 2 are formed in the magnetostrictive member 1 such that the surface roughness Ra of the face formed with the grooves 2 in the short-side direction D2 has a lower limit of suitably 0.5 μm or more and more suitably 0.7 μm or more, a lower limit of suitably 4.5 μm or less, and a range of suitably 0.5 μm or more and 4.5 μm or less. The grooves 2 are suitably formed in the magnetostrictive member 1 such that the lattice constant, the magnetostriction constant, and the parallel magnetostriction amount are in any of the ranges described above. For example, the grooves 2 are suitably formed in the magnetostrictive member 1 by selecting a grinding wheel appropriate to the thickness of the member such that the magnetostriction constant is 250 ppm or more and the parallel magnetostriction amount is 250 ppm or more. The grooves 2 with the lattice constant, the surface roughness Ra, the magnetostriction constant, and the parallel magnetostriction amount in the suitable ranges can be formed by the one-direction processing described above such as the surface grinding. The groove forming step may be performed by a method other than the surface grinding if it can form the grooves 2 capable of modifying the lattice constant on at least one of the front face 3 and the back face 4 of the obtained thin plate member. For example, the thin plate member may be produced with a fixed abrasive grain type wire saw. That is to say, the grooves 2 may be grooves formed when the crystal is sliced with the fixed abrasive grain type wire saw to produce the thin plate member. Cutting with the fixed abrasive grain type wire saw is a method for cutting a workpiece while pressing the workpiece against a plurality of ultrathin wire rows parallel to each other at a fixed pitch and feeding a wire with abrasive grains such as diamond secured with electrodeposition or adhesive in a wire direction. When cutting is performed with the fixed abrasive grain type wire saw, grinding marks are generated in the wire feeding direction, and the grooves 2 similar to those by the surface grinding can be formed. When cutting is performed with the fixed abrasive grain type wire saw, the crystal cutting step (Step S2) and the groove forming step (step S3) can be shared, and thus the thin plate member can be efficiently produced. The grooves 2 may be formed by applying a certain amount of pressure with sandpaper or the like.

Following the groove forming step (Step S3), the cutting step (Step S4) is performed. The cutting step is a step cutting the thin plate member formed with the grooves 2 in the groove forming step to obtain the magnetostrictive member 1 of the present embodiment.

In the cutting step, when the thin plate member formed with the grooves 2 is cut to be made into the magnetostrictive member 1, the thin plate member is cut so as to form the grooves 2 extending in the long-side direction D1 of the magnetostrictive member 1. In the cutting step, the thin plate member is cut into a predetermined size. In the cutting step, the thin plate member is cut as the magnetostrictive member 1 such that the magnetostrictive member 1 becomes a rectangular plate-like body in a plan view. In the cutting step, the thin plate member is cut using a cutting apparatus. The cutting apparatus used in the cutting step is not limited to a particular cutting apparatus. For example, an outer peripheral blade cutting apparatus, a wire electric discharge machine, a wire saw, or the like can be used. The direction in which the magnetostrictive member is extracted from the thin plate member, which is not limited to a particular direction, may be set to a direction allowing efficient acquisition depending on the size of the magnetostrictive member or the like, for example. Through the above-described steps, the magnetostrictive member 1 of the present embodiment can be obtained.

In the present embodiment, the lattice constant is measured with a two-dimensional X-ray diffractometer (XRD). Thus, to measure the lattice constant, the surface to be measured is required to be processed to a mirror surface. As described above, the magnetostriction constant of the magnetostrictive member 1 depends on the condition of the front and back faces of the magnetostrictive member and is not affected by the surface condition of the side faces. Thus, in manufacturing the magnetostrictive member 1, there are no particular limitations on the method for processing the side faces of the magnetostrictive member 1. When the lattice constant is measured as needed, it is measured after grinding and polishing the side faces to be processed to mirror surfaces.

As described above, the method for manufacturing a magnetostrictive member of the present embodiment includes making, in a plate-like body formed of a crystal of an iron-based alloy having magnetostrictive characteristics and having the long-side direction D1 and the short-side direction D2, the lattice constant of the <100> orientation in the short-side direction larger than the lattice constant of the <100> orientation in the long-side direction. In the method for manufacturing a magnetostrictive member of the present embodiment, any configuration other than the above is optional. The method for manufacturing a magnetostrictive member of the present embodiment can manufacture a magnetostrictive member having the characteristics of a high magnetostriction constant and a high parallel magnetostriction amount and small variations in the magnetostriction constant and the parallel magnetostriction amount among members. When the groove 2 are formed in a material having magnetostrictive characteristics as described above, the method for manufacturing a magnetostrictive member of the present embodiment only requires the formation of the grooves 2 and thus can be easily implemented.

EXAMPLES

The following specifically describes the present invention with reference to examples, but the present invention is not limited by these examples in any manner.

Example 1 (Examples 1-1 to 1-5)

With raw materials adjusted with a stoichiometric ratio of iron to gallium of 81:19, a cylindrical single crystal of an Fe—Ga alloy grown by the vertical Bridgman (VB) method was prepared. The growth axis direction of the single crystal was <100>. In the {100} plane of the upper face or the lower face of the single crystal perpendicular to the crystal growth axis direction, the orientation was confirmed by X-ray diffraction. In this process, upper face and lower face samples of the crystal were measured with a Shimadzu sequential plasma emission spectrometer (ICPS-8100), and the concentration of the single crystal had a content of gallium of 17.5 to 19.0 at %.

A magnetostrictive member was manufactured from the grown single crystal as follows. First, using a free abrasive grain type wire saw apparatus, the single crystal was cut in a direction parallel to the single crystal growth direction (parallel to the <100> orientation) to produce a thin plate member with a cut plane, that is, a principal plane of {100}. Then, the obtained thin plate member was subjected to surface grinding with a surface grinder using a flat grinding wheel of #100 by 100 μm each for one face to adjust the thickness of the thin plate member. Then, a cutting position was set such that the long-side direction of the magnetostrictive member was in the same direction as a parallel direction (parallel with respect to the <100> orientation) with respect to the single crystal growth direction, and the magnetostrictive member with a size including a dimension in the long-side direction of 16 mm×a dimension in the short-side of 4 mm×a thickness of 1 mm was cut out with an outer peripheral blade cutting apparatus. Then, the front face and the side faces of the cut-out magnetostrictive member were mirror-polished. Next, the lattice constant, the magnetostriction constant, and the parallel magnetostriction amount of the magnetostrictive member were measured. Subsequently, a plurality of grooves (grinding marks) were formed on the front and back faces of the magnetostrictive member such that the direction of formation of the grooves was in the long-side direction of the magnetostrictive member. The formation of the grooves (grinding marks) was performed by performing surface grinding by 100 μm each for one face with a surface grinder using a flat grinding wheel of #100. Subsequently, the lattice constant, the magnetostriction constant, and the parallel magnetostriction amount of the magnetostrictive member were measured as before processing. The surface roughness of the front and back faces of the magnetostrictive member was also measured.

For the surface roughness, the surface roughness Ra was measured at five locations on the surface of the magnetostrictive member in each of two directions, or the long-side direction and the short-side direction of the magnetostrictive member, with a surface roughness meter (VK-X1050 manufactured by Keyence Corporation) at an observation magnification of 20×, and their average was used as the surface roughness Ra. The surface roughness Ra in the long-side direction was 0.5 to 0.7 µm, whereas the surface roughness Ra in the short-side direction was 1.8 to 2.4 µm.

Next, the lattice constants were evaluated for the <100> directions in three directions, or the long-side direction of the side face of 4×1 mm, the short-side direction of the side face of 16×1 mm, and the front face direction (the thickness direction) of the front face of 16×4 mm. Using a two-dimensional X-ray diffractometer D8 DISCOVER (manufactured by Bruker), the lattice constants were evaluated by measuring a diffraction angle 2θ using a (200) diffraction peak to calculate a d value and then doubling the d value. The obtained lattice constants in the three directions were multiplied, and the cube root thereof was calculated to be an average. Before grooving, the lattice constant in the long-side direction was 2.9030 to 2.9043 Å, the lattice constant in the short-side direction was 2.9018 to 2.9032 Å, and the lattice constant in the front face direction (the thickness direction) was 2.9035 to 2.9044 Å. The average of the lattice constants was 2.9031 to 2.9035 Å.

After grooving, the lattice constant in the long-side direction was 2.9026 to 2.9033 Å and the lattice constant in the short-side direction was 2.9041 to 2.9054 Å, and the lattice constant in the short-side direction was larger in all the values.

Figure 8:
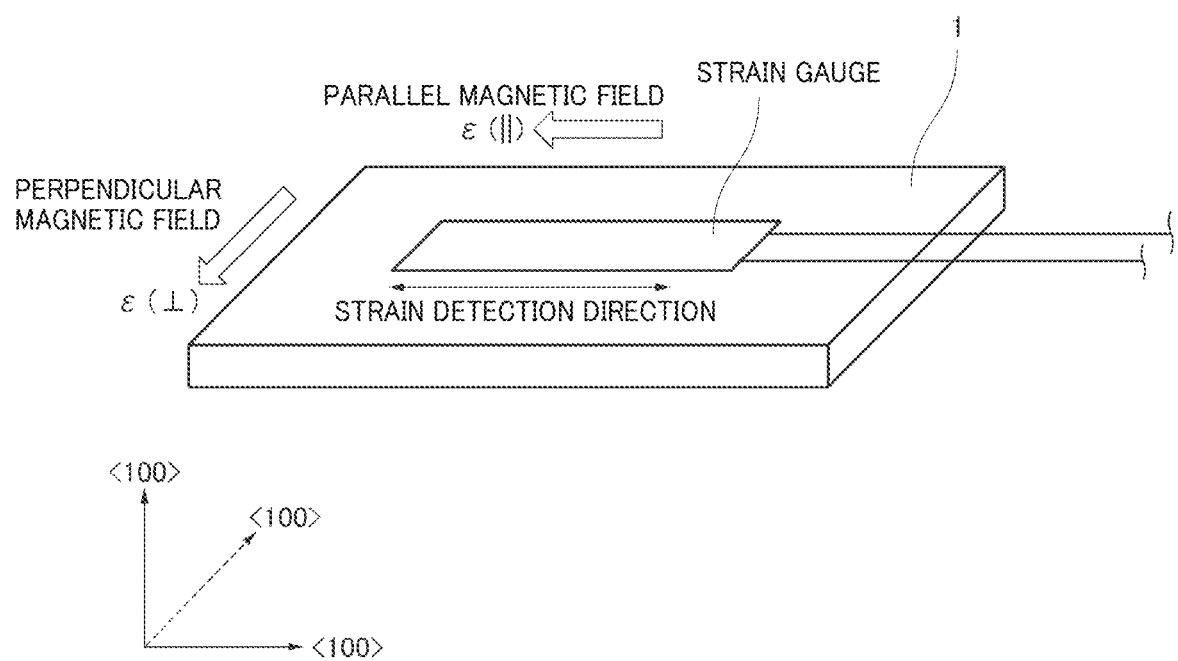
FIG. 8 is a diagram of a strain gauge method used in examples.

Next, magnetostrictive characteristics were measured for the magnetostrictive member. Measurement of the magnetostrictive characteristics was performed by the strain gauge method. As illustrated in FIG. 8, a strain gauge (manufactured by Kyowa Electronic Instruments Co., Ltd.) was bonded to the {100} plane, which is the principal plane of the manufactured magnetostrictive member, using adhesive. The long-side direction of the strain gauge is a magnetostriction detection direction, and thus the strain gauge was bonded such that its long-side direction was parallel to the long-side direction of the magnetostrictive member and the <100> orientation.

A magnetostriction measuring instrument (manufactured by Kyowa Electronic Instruments Co., Ltd.) included a neodymium-based permanent magnet, a bridge box, a compact recording system, a strain unit, and dynamic data acquisition software.

The magnetostriction amount was determined by correcting an actual strain detection value by a gauge factor.

The gauge factor was determined by Expression (3) below.

$$\varepsilon = 2.00/Ks \times \varepsilon i \qquad \text{Expression (3)}$$

($\varepsilon$: the gauge factor, $\varepsilon i$: a measured strain value, $Ks$: the gauge factor of the used gauge)

The magnetostriction amount when the magnetic field direction was parallel to the long-side direction of the strain gauge was defined as the parallel magnetostriction amount. On the other hand, the magnetostriction amount when the magnetic field direction was perpendicular to the long-side direction of the strain gauge was defined as the perpendicular magnetostriction amount. The magnetostriction constant was determined by the difference between the parallel magnetostriction amount and the perpendicular magnetostriction amount in accordance with Expression (1). This magnetostrictive member, before grooving, had a magnetostriction constant of 284 to 293 ppm and a parallel magnetostriction amount of 66 to 273 ppm and, after grooving, had a magnetostriction constant of 283 to 296 ppm and a parallel magnetostriction amount of 271 to 293 ppm. Tables 2 and 3 list the manufacturing conditions and the evaluation results. "Ratio" listed in Table 3 and the like is the value of the magnetostriction constant/the parallel magnetostriction amount (unit: %). "Difference" listed in Table 3 and the like is the value of (the lattice constant in the short-side direction)−(the lattice constant in the long-side direction). The ratio indicating the magnetostriction constant/the parallel magnetostriction amount (unit: %) was 96% to 101% as listed in Table 3. The difference indicating the value of the lattice constant in the short-side direction−the lattice constant in the long-side direction was 0.0011 to 0.0028 Å and was 379 ppm to 965 ppm in terms of ppm as listed in Table 2.

TABLE 2

| | Lattice constant (Å) | | | | | | | | |
|---|---|---|---|---|---|---|---|---|---|
| | Before grooving | | | | After grooving | | | | |
| | Long-side | Short-side | Front face | Average | Long-side | Short-side | Front face | Average | Difference |
| Example 1-1 | 2.9035 | 2.9032 | 2.9037 | 2.9035 | 2.9029 | 2.9045 | — | — | 0.0016 (551 ppm) |
| Example 1-2 | 2.9043 | 2.9020 | 2.9038 | 2.9034 | 2.9030 | 2.9041 | — | — | 0.0011 (379 ppm) |
| Example 1-3 | 2.9038 | 2.9026 | 2.9035 | 2.9033 | 2.9026 | 2.9054 | — | — | 0.0028 (965 ppm) |
| Example 1-4 | 2.9034 | 2.9028 | 2.9041 | 2.9034 | 2.9029 | 2.9046 | — | — | 0.0017 (586 ppm) |
| Example 1-5 | 2.9030 | 2.9018 | 2.9044 | 2.9031 | 2.9033 | 2.9046 | — | — | 0.0013 (448 ppm) |

TABLE 3

| | Magnetostriction amount in long-side direction (ppm) | | | | | |
|---|---|---|---|---|---|---|
| | Before grooving | | | After grooving | | |
| | Magneto-striction constant | Parallel magneto-striction amount | Ratio | Magneto-striction constant | Parallel magneto-striction amount | Ratio |
| Example 1-1 | 290 | 265 | 91% | 294 | 289 | 98% |
| Example 1-2 | 287 | 66 | 23% | 283 | 271 | 96% |
| Example 1-3 | 284 | 167 | 59% | 287 | 285 | 99% |
| Example 1-4 | 293 | 273 | 93% | 289 | 292 | 101% |
| Example 1-5 | 290 | 241 | 83% | 296 | 293 | 99% |

Example 2

A magnetostrictive member was manufactured from a single crystal with a content of gallium of 17.5 to 19.0 at %, grown as in Example 1. First, using a free abrasive grain type wire saw apparatus, the single crystal was cut in a direction parallel to the single crystal growth direction (parallel to the <100> orientation) to produce a thin plate member with a cut plane, that is, a principal plane of {100}. Then, the obtained thin plate member was subjected to surface grinding with a surface grinder using a flat grinding wheel of #200 by 100 μm each for one face to adjust the thickness of the thin plate member and to form a plurality of grooves (grinding marks) on the front and back faces. Then, a cutting position was set such that the long-side direction of the magnetostrictive member was in the same direction as a grinding direction during the surface grinding, that is, a grinding mark direction, and the magnetostrictive member with a size including a dimension in the long-side direction of 16 mm×a dimension in the short-side of 4 mm×a thickness of 0.5 mm was cut out with an outer peripheral blade cutting apparatus.

Next, by the same method as in Example 1, the surface roughness Ra was measured at five locations in each of two directions, or the long-side direction and the short-side direction of the magnetostrictive member, and their average was used as the surface roughness Ra. The surface roughness Ra in the long-side direction was 0.3 to 0.5 μm, whereas the surface roughness Ra in the short-side direction was 1.1 to 1.5 μm.

Next, by the same method as in Example 1, the lattice constant in two directions of the side faces of the cut-out magnetostrictive member was evaluated. The lattice constant in the long-side direction was 2.9024 to 2.9031 Å, the lattice constant in the short-side direction was 2.9038 to 2.9044 Å, and the lattice constant in the short-side direction was larger in all the values.

Next, by the same method as in Example 1, the magnetostrictive characteristics in the long-side direction were measured for the cut-out magnetostrictive member. When being processed with the long-side direction being parallel to the grinding mark direction, the magnetostriction constant of this magnetostrictive member was 275 to 291 ppm, whereas the parallel magnetostriction amount thereof was 260 to 289 ppm. Table 4 lists the manufacturing conditions and the evaluation results. The ratio indicating the magnetostriction constant/the parallel magnetostriction amount (unit: %) was 94% to 99% as listed in Table 4. The difference indicating the value of the lattice constant in the short-side direction–the lattice constant in the long-side direction was 0.0010 to 0.0017 Å and was 344 ppm to 586 ppm in terms of ppm as listed in Table 4.

TABLE 4

| | | | | Dimensions (mm) | | | Lattice constant (Å) | | | | | Magnetostriction amount in long-side direction (ppm) | | |
|---|---|---|---|---|---|---|---|---|---|---|---|---|---|---|
| | Surface finishing | Groove formation direction | Groove forming grinding wheel | Long-side | Short-side | Plate thick-ness | Long-side | Short-side | Front face | Average | Difference (short-side – long-side) | Magneto-striction constant | Parallel magneto-striction amount | Ratio |
| Example 2 | Grinding | Long-side | #200 | 16 | 4 | 0.5 | 2.9027 | 2.9043 | — | — | 0.0016 (551 ppm) | 291 | 289 | 99% |
| | Grinding | Long-side | #200 | 16 | 4 | 0.5 | 2.9028 | 2.9038 | — | — | 0.0010 (344 ppm) | 286 | 279 | 98% |
| | Grinding | Long-side | #200 | 16 | 4 | 0.5 | 2.9024 | 2.9041 | — | — | 0.0017 (586 ppm) | 275 | 260 | 95% |
| | Grinding | Long-side | #200 | 16 | 4 | 0.5 | 2.9030 | 2.9040 | — | — | 0.0010 (344 ppm) | 279 | 277 | 99% |
| | Grinding | Long-side | #200 | 16 | 4 | 0.5 | 2.9031 | 2.9044 | — | — | 0.0013 (448 ppm) | 282 | 264 | 94% |

Example 3

A magnetostrictive member was manufactured from a single crystal with a content of gallium of 17.5 to 19.0 at %, grown as in Example 1. First, using a free abrasive grain type wire saw apparatus, the single crystal was cut in a direction parallel to the single crystal growth direction (parallel to the <100> orientation) to produce a thin plate member with a cut plane, that is, a principal plane of {100}. Then, the obtained thin plate member was subjected to surface grinding with a surface grinder using a flat grinding wheel of #400 by 100 μm each for one face to adjust the thickness of the thin plate member and to form a plurality of grooves (grinding marks) on the front and back faces. Then, a cutting position was set such that the long-side direction of the magnetostrictive member was in the same direction as a grinding direction during the surface grinding, that is, a grinding mark direction, and the magnetostrictive member with a size including a dimension in the long-side direction of 16 mm×a dimension in the short-side of 4 mm×a thickness of 0.3 mm was cut out with an outer peripheral blade cutting apparatus.

Next, by the same method as in Example 1, the surface roughness Ra was measured at five locations in each of two directions, or the long-side direction and the short-side direction of the magnetostrictive member, and their average was used as the surface roughness Ra. The surface roughness Ra in the long-side direction was 0.2 to 0.4 μm, whereas the surface roughness Ra in the short-side direction was 0.5 to 1.0 μm.

Next, by the same method as in Example 1, the lattice constant in two directions of the side faces of the cut-out magnetostrictive member was evaluated. The lattice constant in the long-side direction was 2.9025 to 2.9032 Å, the lattice constant in the short-side direction was 2.9040 to 2.9053 Å, and the lattice constant in the short-side direction was larger in all the values.

Next, by the same method as in Example 1, the magnetostrictive characteristics in the long-side direction were measured for the cut-out magnetostrictive member. When being processed with the long-side direction being parallel to the grinding mark direction, the magnetostriction constant of this magnetostrictive member was 265 to 288 ppm, whereas the parallel magnetostriction amount thereof was 255 to 280 ppm. Table 5 lists the manufacturing conditions and the evaluation results. The ratio indicating the magnetostriction constant/the parallel magnetostriction amount (unit: %) was 93% to 102% as listed in Table 5. The difference indicating the value of the lattice constant in the short-side direction−the lattice constant in the long-side direction was 0.0015 to 0.0021 Å and was 517 ppm to 723 ppm in terms of ppm as listed in Table 5.

TABLE 5

| | Surface finishing | Groove formation direction | Groove forming grinding wheel | Dimensions (mm) Long-side | Dimensions (mm) Short-side | Dimensions (mm) Plate thickness | Lattice constant (Å) Long-side | Lattice constant (Å) Short-side | Lattice constant (Å) Front face | Lattice constant (Å) Average | Difference (short-side − long-side) | Magnetostriction amount in long-side direction (ppm) Magnetostriction constant | Magnetostriction amount in long-side direction (ppm) Parallel magnetostriction amount | Ratio |
|---|---|---|---|---|---|---|---|---|---|---|---|---|---|---|
| Example 3 | Grinding | Long-side | #400 | 16 | 4 | 0.3 | 2.9025 | 2.9042 | — | — | 0.0017 (586 ppm) | 265 | 255 | 96% |
| | Grinding | Long-side | #400 | 16 | 4 | 0.3 | 2.9027 | 2.9046 | — | — | 0.0019 (655 ppm) | 288 | 280 | 97% |
| | Grinding | Long-side | #400 | 16 | 4 | 0.3 | 2.9025 | 2.9040 | — | — | 0.0015 (517 ppm) | 266 | 270 | 102% |
| | Grinding | Long-side | #400 | 16 | 4 | 0.3 | 2.9032 | 2.9053 | — | — | 0.0021 (723 ppm) | 274 | 255 | 93% |
| | Grinding | Long-side | #400 | 16 | 4 | 0.3 | 2.9028 | 2.9045 | — | — | 0.0017 (586 ppm) | 270 | 274 | 101% |

Example 4

A magnetostrictive member was manufactured from a single crystal with a content of gallium of 17.5 to 19.0 at %, grown as in Example 1. First, using a free abrasive grain type wire saw apparatus, the single crystal was cut in a direction parallel to the single crystal growth direction (parallel to the <100> orientation) to produce a thin plate member with a cut plane, that is, a principal plane of {100}. Then, the obtained thin plate member was subjected to surface grinding with a surface grinder using a flat grinding wheel of #100 by 100 μm each for one face to adjust the thickness of the thin plate member and to form a plurality of grooves (grinding marks) on the front and back faces. Then, a cutting position was set such that the long-side direction of the magnetostrictive member was in the same direction as a grinding direction during the surface grinding, that is, a grinding mark direction, and the magnetostrictive member with a size including a dimension in the long-side direction of 16 mm×a dimension in the short-side of 8 mm×a thickness of 1 mm was cut out with an outer peripheral blade cutting apparatus.

Next, by the same method as in Example 1, the surface roughness Ra was measured at five locations in each of two directions, or the long-side direction and the short-side direction of the magnetostrictive member, and their average was used as the surface roughness Ra. The surface roughness Ra in the long-side direction was 0.5 to 0.6 μm, whereas the surface roughness Ra in the short-side direction was 1.6 to 2.2 μm.

Next, by the same method as in Example 1, the lattice constant in two directions of the side faces of the cut-out magnetostrictive member was evaluated. The lattice constant in the long-side direction was 2.9024 to 2.9030 Å, the lattice constant in the short-side direction was 2.9040 to 2.9050 Å, and the lattice constant in the short-side direction was larger in all the values.

Next, by the same method as in Example 1, the magnetostrictive characteristics in the long-side direction were measured for the cut-out magnetostrictive member. When being processed with the long-side direction being parallel to the grinding mark direction, the magnetostriction constant of this magnetostrictive member was 283 to 301 ppm, whereas the parallel magnetostriction amount thereof was 277 to 301 ppm. Table 6 lists the manufacturing conditions and the evaluation results. The ratio indicating the magnetostriction constant/the parallel magnetostriction amount (unit: %) was 98% to 100% as listed in Table 6. The difference indicating the value of the lattice constant in the short-side direction–the lattice constant in the long-side direction was 0.0010 to 0.0026 Å and was 344 ppm to 896 ppm in terms of ppm as listed in Table 6.

TABLE 6

| | | | Groove Dimensions (mm) | | | | Lattice constant (Å) | | | | | Magnetostriction amount in long-side direction (ppm) | | |
| --- | --- | --- | --- | --- | --- | --- | --- | --- | --- | --- | --- | --- | --- | --- |
| | Surface finishing | Groove formation direction | Groove forming grinding wheel | Long-side | Short-side | Plate thickness | Long-side | Short-side | Front face | Average | Difference (short-side – long-side) | Magnetostriction constant | Parallel magnetostriction amount | Ratio |
| Example 4 | Grinding | Long-side | #100 | 16 | 8 | 1 | 2.9029 | 2.9043 | — | — | 0.0014 (482 ppm) | 290 | 287 | 99% |
| | Grinding | Long-side | #100 | 16 | 8 | 1 | 2.9030 | 2.9040 | — | — | 0.0010 (344 ppm) | 301 | 301 | 100% |
| | Grinding | Long-side | #100 | 16 | 8 | 1 | 2.9024 | 2.9050 | — | — | 0.0026 (896 ppm) | 299 | 294 | 98% |
| | Grinding | Long-side | #100 | 16 | 8 | 1 | 2.9028 | 2.9046 | — | — | 0.0018 (620 ppm) | 292 | 290 | 99% |
| | Grinding | Long-side | #100 | 16 | 8 | 1 | 2.9025 | 2.9042 | — | — | 0.0017 (586 ppm) | 283 | 277 | 98% |

Example 5

A magnetostrictive member was manufactured from a single crystal with a content of gallium of 17.5 to 19.0 at %, grown as in Example 1. First, using a free abrasive grain type wire saw apparatus, the single crystal was cut in a direction parallel to the single crystal growth direction (parallel to the <100> orientation) to produce a thin plate member with a cut plane, that is, a principal plane of {100}. Then, the obtained thin plate member was subjected to surface grinding with a surface grinder using a flat grinding wheel of #40 by 50 μm each for one face to adjust the thickness of the thin plate member and to form a plurality of grooves (grinding marks) on the front and back faces. Then, a cutting position was set such that the long-side direction of the magnetostrictive member was in the same direction as a grinding direction during the surface grinding, that is, a grinding mark direction, and the magnetostrictive member with a size including a dimension in the long-side direction of 16 mm×a dimension in the short-side of 8 mm×a thickness of 2 mm was cut out with an outer peripheral blade cutting apparatus.

Next, by the same method as in Example 1, the surface roughness Ra was measured at five locations in each of two directions, or the long-side direction and the short-side direction of the magnetostrictive member, and their average was used as the surface roughness Ra. The surface roughness Ra in the long-side direction was 1.1 to 1.3 μm, whereas the surface roughness Ra in the short-side direction was 2.6 to 4.3 μm.

Next, by the same method as in Example 1, the lattice constant in two directions of the side faces of the cut-out magnetostrictive member was evaluated. The lattice constant in the long-side direction was 2.9028 to 2.9034 Å, the lattice constant in the short-side direction was 2.9038 to 2.9056 Å, and the lattice constant in the short-side direction was larger in all the values.

Next, by the same method as in Example 1, the magnetostrictive characteristics in the long-side direction were measured for the cut-out magnetostrictive member. When being processed with the long-side direction being parallel to the grinding mark direction, the magnetostriction constant of this magnetostrictive member was 282 to 311 ppm, whereas the parallel magnetostriction amount thereof was 271 to 301 ppm. Table 7 lists the manufacturing conditions and the evaluation results. The ratio indicating the magnetostriction constant/the parallel magnetostriction amount (unit: %) was 95% to 97% as listed in Table 7. The difference indicating the value of the lattice constant in the short-side direction−the lattice constant in the long-side direction was 0.0010 to 0.0022 Å and was 344 ppm to 758 ppm in terms of ppm as listed in Table 7.

TABLE 7

| | | | Dimensions (mm) | | | Lattice constant (Å) | | | | | Magnetostriction amount in long-side direction (ppm) | | |
|---|---|---|---|---|---|---|---|---|---|---|---|---|---|
| | Surface finishing | Groove formation direction | Groove forming grinding wheel | Long-side | Short-side | Plate thickness | Long-side | Short-side | Front face | Average | Difference (short-side − long-side) | Magnetostriction constant | Parallel magnetostriction amount | Ratio |
| Example 5 | Grinding | Long-side | #40 | 16 | 8 | 2 | 2.9032 | 2.9042 | — | — | 0.0010 (344 ppm) | 300 | 290 | 97% |
| | Grinding | Long-side | #40 | 16 | 8 | 2 | 2.9034 | 2.9056 | — | — | 0.0022 (758 ppm) | 282 | 271 | 96% |
| | Grinding | Long-side | #40 | 16 | 8 | 2 | 2.9028 | 2.9038 | — | — | 0.0010 (344 ppm) | 292 | 280 | 96% |
| | Grinding | Long-side | #40 | 16 | 8 | 2 | 2.9030 | 2.9043 | — | — | 0.0013 (448 ppm) | 304 | 290 | 95% |
| | Grinding | Long-side | #40 | 16 | 8 | 2 | 2.9029 | 2.9046 | — | — | 0.0017 (586 ppm) | 311 | 301 | 97% |

Comparative Example 1 (Comparative Examples 1-1 to 1-5)

Of the magnetostrictive materials prepared in Example 1, using the same magnetostrictive members as those of Example 1 before grooving, a plurality of grooves (grinding marks) were formed on the front and back faces of the magnetostrictive members such that the direction of forming the grooves was in the short-side direction of the magnetostrictive members. The other conditions were the same as in Example 1.

For the surface roughness, by the same method as in Example 1, the surface roughness Ra was measured at five locations in each of two directions, or the long-side direction and the short-side direction of the magnetostrictive member, and their average was used as the surface roughness Ra. The surface roughness Ra in the long-side direction was 1.8 to 2.4 μm, whereas the surface roughness Ra in the short-side direction was 0.5 to 0.7 μm.

Next, by the same method as in Example 1, the lattice constant in each direction of the cut-out magnetostrictive member was evaluated before and after grooving. Before grooving, the lattice constant in the long-side direction was 2.9030 to 2.9048 Å, the lattice constant in the short-side direction was 2.9022 to 2.9031 Å, and the lattice constant in the front face direction (the thickness direction) was 2.9036 to 2.9042 Å. The average of the lattice constants was 2.6035 to 2.9035 Å.

After grooving, the lattice constant in the long-side direction was 2.9042 to 2.9057 Å, the lattice constant in the short-side direction was 2.9024 to 2.9030 Å, and the lattice constant in the long-side direction was larger in all the values.

Next, by the same method as in Example 1, the magnetostrictive characteristics in the long-side direction were measured for the cut-out magnetostrictive member before and after grooving. The magnetostrictive member, before grooving, had a magnetostriction constant of 284 to 297 ppm and a parallel magnetostriction amount of 20 to 284 ppm, and the magnetostrictive member, after grooving, had a magnetostriction constant of 283 to 295 ppm and a parallel magnetostriction amount of 15 to 31 ppm, which was a low level. Table 8 and 9 list the manufacturing conditions and the evaluation results. The ratio indicating the magnetostriction constant/the parallel magnetostriction amount (unit %) after grooving was 5% to 11% as listed in Table 9. The difference indicating the value of the lattice constant in the short-side direction−the lattice constant in the long-side direction was −0.0032 to −0.0012 Å and was −1,101 to −413 ppm in terms of ppm as listed in Table 8.

TABLE 8

| | Lattice constant (Å) | | | | | | | | |
|---|---|---|---|---|---|---|---|---|---|
| | Before grooving | | | | After grooving | | | | Difference (short-side − long-side) |
| | Long-side | Short-side | Front face | Average | Long-side | Short-side | Front face | Average | |
| Comparative Example 1-1 | 2.9033 | 2.9028 | 2.9040 | 2.9034 | 2.9042 | 2.9030 | — | — | −0.0012 (−413 ppm) |
| Comparative Example 1-2 | 2.9048 | 2.9022 | 2.9036 | 2.9035 | 2.9057 | 2.9025 | — | — | −0.0032 (−1101 ppm) |
| Comparative Example 1-3 | 2.9039 | 2.9026 | 2.9036 | 2.9034 | 2.9050 | 2.9028 | — | — | −0.0022 (−757 ppm) |
| Comparative Example 1-4 | 2.9032 | 2.0931 | 2.9041 | 2.6035 | 2.9049 | 2.9030 | — | — | −0.0019 (−654 ppm) |
| Comparative Example 1-5 | 2.9030 | 2.9022 | 2.9042 | 2.9031 | 2.9043 | 2.9024 | — | — | −0.0019 (−654 ppm) |

TABLE 9

| | Magnetostriction amount in long-side direction (ppm) | | | | | |
|---|---|---|---|---|---|---|
| | Before grooving | | | After grooving | | |
| | Magnetostriction constant | Parallel magnetostriction amount | Ratio | Magnetostriction constant | Parallel magnetostriction amount | Ratio |
| Comparative Example 1-1 | 294 | 273 | 93% | 288 | 24 | 8% |
| Comparative Example 1-2 | 292 | 20 | 7% | 290 | 15 | 5% |
| Comparative Example 1-3 | 284 | 165 | 58% | 283 | 22 | 8% |
| Comparative Example 1-4 | 291 | 284 | 98% | 287 | 31 | 11% |
| Comparative Example 1-5 | 297 | 278 | 94% | 295 | 16 | 5% |

CONCLUSION

From the results of Example 1 (Examples 1-1 to 1-5) and Comparative Example 1 (Comparative Examples 1-1 to 1-5), it is considered that the lattice constants of the {100} planes in the three directions are asymmetric and the magnetization direction is located in the <100> direction having a larger lattice constant due to residual strain in the crystal, and it is inferred that the lattice constant of the magnetostrictive members varied due to a variation in the residual strain in the crystal. In contrast, by forming the grooves in the long-side direction of the magnetostrictive member, the lattice constant of the <100> orientation in the short-side direction of the magnetostrictive member was able to be aligned to be a lattice constant larger than the lattice constant of the <100> orientation in the long-side direction.

From the results of the Examples 1 to 5, the modification of the magnetostriction constant and the parallel magnetostriction amount is confirmed by the formation of the grooves. From the results of Examples 1 to 5, it is confirmed that the magnetostrictive member 1 of the present embodiment has the characteristics of a high magnetostriction constant and a high parallel magnetostriction amount and small variations in the magnetostriction constant and the parallel magnetostriction amount among members. From the results of the examples, it is confirmed that the method for manufacturing a magnetostrictive member of an aspect of the present invention can easily manufacture a magnetostrictive member having a high magnetostriction constant and a high parallel magnetostriction amount and small variations in the magnetostriction constant and the parallel magnetostriction amount among members.

The technical scope of the present invention is not limited to the aspects described in the embodiments and the like described above. One or more of the requirements described in the embodiments and the like described above may be omitted. The requirements described in the embodiments and the like described above can be combined as appropriate. To the extent permitted by law, the disclosure of Japanese Patent Application No. 2021-019132, which is a Japanese patent application, and all the references cited in the embodiments and the like described above is incorporated herein by reference.

DESCRIPTION OF REFERENCE SIGNS

1 Magnetostrictive member
2 Groove
3 Front face
4 Back face
D1 Long-side direction
D2 Short-side direction

The invention claimed is:

1. A magnetostrictive member
formed of a single crystal of an iron-based alloy having magnetostrictive characteristics,
being a plate shaped body having a long-side direction and a short-side direction, and
having a lattice constant of a <100> orientation in the short-side direction that is larger than a lattice constant of a <100> orientation in the long-side direction.

2. The magnetostrictive member according to claim 1, wherein the lattice constant of the <100> orientation in the short-side direction is larger than the lattice constant of the <100> orientation in the long-side direction by 300 ppm or more.

3. The magnetostrictive member according to claim 1, wherein
the iron-based alloy is an Fe—Ga alloy,
the magnetostrictive member has a lattice constant in the long-side direction of 2.9034 Å or less and has one of lattice constants of <100> orientations other than the long-side direction larger than the lattice constant of the <100> orientation in the long-side direction by 0.0008 Å or more,
the magnetostrictive member has a magnetostriction constant of 250 ppm or more, and
the magnetostrictive member has a parallel magnetostriction amount of 250 ppm or more,
the parallel magnetostriction amount being a magnetostriction amount when a magnetic field parallel to the long-side direction is applied and a magnetostriction amount in the long-side direction is saturated.

4. The magnetostrictive member according to claim 1, wherein a thickness of the plate shaped body is 0.3 mm or more and 2 mm or less.

5. A method for manufacturing a magnetostrictive member, the method comprising cutting a crystal of an iron-based alloy and thereby preparing a plate shaped body
- formed of the crystal of the iron-based alloy having magnetostrictive characteristics and having a long-side direction D1 and a short-side direction D2, and
- having a lattice constant of a <100> orientation in the short-side direction larger than a lattice constant of a <100> orientation in the long-side direction.

6. A magnetostrictive member
- formed of a single crystal of an iron-based alloy having magnetostrictive characteristics, and
- being a plate shaped body having a long-side direction and a short-side direction,
- at least one of a front face and a back face of the plate shaped body having a one-direction processed face with the long-side direction serving as a processing direction, wherein the one-direction processed face has grooves extending in the long-side direction.

* * * * *